United States Patent [19]

Zook

[11] Patent Number: 4,845,713
[45] Date of Patent: Jul. 4, 1989

[54] METHOD AND APPARATUS FOR DETERMINING THE COEFFICIENTS OF A LOCATOR POLYNOMIAL

[75] Inventor: Christopher P. Zook, Lafayette, Colo.

[73] Assignee: Exabyte Corporation, Boulder, Colo.

[21] Appl. No.: 59,642

[22] Filed: Jun. 8, 1987

[51] Int. Cl.$^4$ .............................................. G06F 11/10
[52] U.S. Cl. .................................................... 371/37
[58] Field of Search ......................... 371/37, 38, 39, 40

[56] References Cited

U.S. PATENT DOCUMENTS

| | | | |
|---|---|---|---|
| 4,162,480 | 7/1979 | Berlekamp | 371/37 |
| 4,410,989 | 10/1983 | Berlekamp | 371/40 |
| 4,494,234 | 1/1985 | Patel | 371/38 |
| 4,559,625 | 12/1985 | Berlekamp | 371/2 |
| 4,584,686 | 4/1986 | Fritze | 371/37 |
| 4,633,470 | 12/1986 | Welch et al. | 371/37 |
| 4,642,808 | 2/1987 | Baggen | 371/39 |
| 4,649,541 | 3/1987 | Lahmeyer | 371/37 |
| 4,665,523 | 5/1987 | Citron et al. | 371/37 |
| 4,675,869 | 6/1987 | Driessen | 371/37 |

OTHER PUBLICATIONS

IEEE Transactions on Computers, vol. C33, No. 10, Oct. 1984, IEEE, In-Shek Hsu et al.: "The VLSI Implementation of a Reed-Solomon Encoder Using Berlekamp's Bit-Serial Multiplier Algorithm", pp. 906-911.

The 10th Annual International Symposium on Computer Architecture, Conference Proceedings, 1983, ACM, A. L. Fisher et al.: "Architecture of the PSC: A Programmable Systolic Chip", pp. 48-53.

IEEE Transactions on Computers, vol. C-31, No. 2, Feb. 1982, IEEE, Kuang Y. Liu: "Architecture for VLSI Design of Reed-Solomon Encoders", pp. 170-175.

MILCOM 86, 1986 IEEE Military Communications Conference, 5-9 Oct. 1986, Monterey, California, Conference Record, vol. 3 of 3, IEEE (US), G. K. Maki et al.: "VLSI Reed Solomon Decoder Design", pp. 46.5.1-46.5.6.

IEEE Transactions on Computers, vol. C-34, No. 5, May 1985, IEEE, H. M. Shao et al.: "A VLSI Design of a Pipeline Reed-Solomon Decoder", pp. 393-403.

IEEE Transactions on Computers, vol. C-33, No. 2, Feb. 1984, IEEE, K. Y. Liu: "Architecture for VLSI Design of Reed-Solomon Decoders", pp. 178-189.

Carhoun, D. O., Johnson, B. L., and Meehan, S. J., "Transform Decoding of Reed-Solomon Codes, vol. I: Algorithm and Signal Processing Structure," ESD--TR-82-403, vol. I, Nov. 1982.

Massey, J. L., "Shift Register Synthesis and BCH Decoding: IEEE Transactions on Information Theory", IT-15, No. 1, pp. 122-123, Jan. 1969.

*Primary Examiner*—Charles E. Atkinson
*Attorney, Agent, or Firm*—Griffin, Branigan & Butler

[57] ABSTRACT

For decoding a Reed-Solomon codeword with (n−K) check characters an error/erasure locator (32) executes a codeword cycle comprising (n−K) "coefficient" iterations followed by (n−K) "modified syndrome" iterations. The error/erasure locator (32) includes a bank (52) of simultaneously loadable syndrome registers and a bank (56) of coefficient registers. The syndrome registers are connected to one another in a circular shift path (91). The error/erasure locator (32) further includes a cascading arrangement of PISO multipliers (54), a SIPO multiplier (60), and PISO multipliers (61). The PISO multipliers (54) operate upon the contents of the syndrome registers (52) (expressed in a conventional basis representation) and the contents of the coefficient register (56) (expressed in dual basis representation) to obtain a serial current discrepancy $d_n$. The SIPO multiplier 60 multiplies the serial current discrepancy $d_n$ by a parallel-formatted multiplicative inverse $d_m{}^{-1}\beta_i$ of a prior discrepancy (expressed in dual basis representation) to obtain in one set of clock cycles, the product $d_n d_m{}^{-1}$. During a second set of clock cycles the discrepancy product $d_n d_m{}^{-1}$ is further multiplied using a second bank (61) of PISO multipliers by the contents of corresponding auxiliary registers (62) to obtain a serial product useful for updating the coefficient registers (56). The syndrome registers (52) perform the dual purpose of storing the original syndromes during the coefficient iteration and of storing the modified syndromes produced during the modified syndrome iteration.

55 Claims, 11 Drawing Sheets

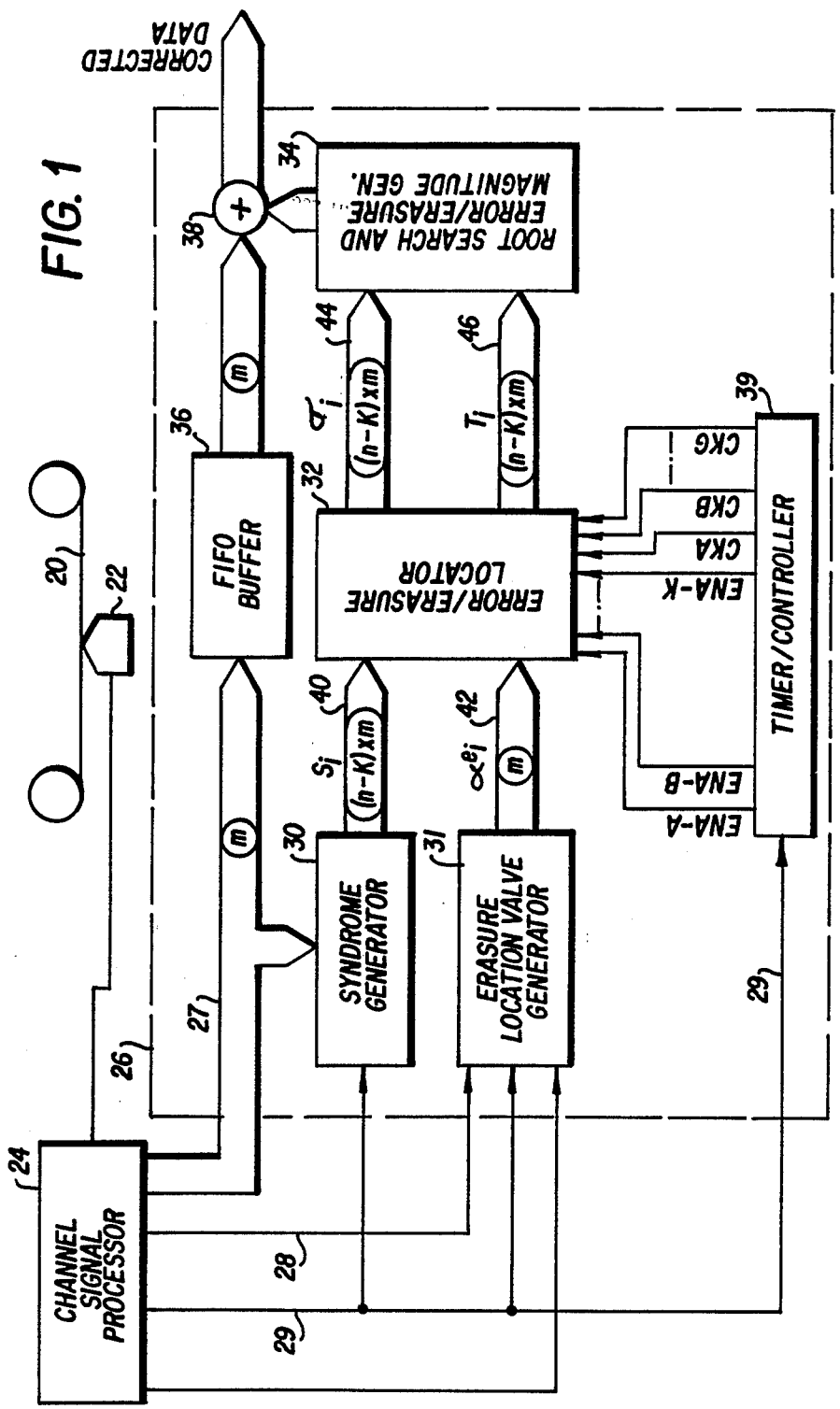

METHOD AND APPARATUS FOR DETERMINING THE COEFFICIENTS OF A LOCATOR POLYNOMIAL

BACKGROUND OF THE INVENTION

I. Field of the Invention

This invention relates to method and apparatus for error correction of stored or transmitted data, and particularly to method and apparatus for decoding codewords to obtain the coefficients of an error/erasure locator polynomial.

II. Prior Art and Other Considerations

Noise occurring in the transmission of data, or in the storing and retrieving of data, can result in errors. Accordingly, various encoding techniques have been developed to specially encode the transmitted or stored data in order to afford an error correction capability.

In accordance with such encoding techniques, a set of message or information bits has a set of check bits appended thereto to form a codeword. The check bits for the codeword are derived by an encoder. In this regard, the encoder essentially treats the bits comprising the set of message bits as coefficients of a binary message polynomial and derives the check bits by operating on the message polynomial (as by multiplication or division) with a generator polynomial G(X). The generator polynomial is selected to impart desired properties to codewords upon which it operates so that the codewords will belong to a particular class of error-correcting binary group codes.

One class of error correcting codes is the well-known BCH codes, which include Reed-Solomon codes. The mathematical basis of Reed-Solomon codes is expounded in Berlekamp, *Algebraic Coding Theory*, McGraw-Hill, 1968, and summarized in U.S. Pat. No. 4,162,480 to Berlekamp, the latter of which is incorporated herein by reference. According to this exposition, a Reed-Solomon code is one having a generator polynomial G(X) defined as follows:

$$G(X) = \prod_{i=1}^{d-1} (X - \alpha^i)$$

where $\alpha$ is a primitive element in the Galois Field $GF(2^m)$, and where d is the code's designed distance. Discussions of Reed-Solomon codes are also provided in other treatises such as Peterson and Weldon, *Error-Correcting Codes*, Second Edition, The MIT Press, 1972, and Wakerly, *Error Detecting Codes, Self-Checking Circuits and Application*, North-Holland, 1978.

Upon receipt or retrieval of a transmitted or stored codeword, noise may have added an error pattern to the codeword. To correct for the addition of such an error pattern when dealing with Reed-Solomon codes, a four step procedure is generally utilized. In discussing the error-correcting procedure, we shall consider a Reed-Solomon code consisting of codewords containing n m-bit symbols (of which K symbols are informational symbols and n−K symbols are check symbols). As a first error correcting step, syndrome characters $S_0$, $S_l$ . . . $S_{n-K-1}$ are calculated. As a second step, using the syndrome characters, the coefficients $\sigma_0$, $\sigma_1$, $\sigma_2$, . . . $\sigma_{n-K-1}$ of an error locator polynomial $\sigma(X)$ are calculated. As a third step, the error locator polynomial $\sigma(X)$ is solved for its roots $X_i$, which are the error locations in the received codeword. As a fourth step, using the error locations $X_i$ and the syndrome characters S, error values are calculated. Mathematical expressions for the syndrome characters and the coefficients of the error locator polynomial are set forth in the afore-referenced U.S. Pat. No. 4,162,480 to Berlekamp and Chapter 9 of the afore-mentioned Peterson and Weldon treatise.

The second step in the above-described generalized error correcting procedure, i.e., the step of calculating the coefficients of the error locator polynomial, is computationally intensive. A popular algorithm for obtaining the coefficients of the error locator polynomial is the Berlekamp-Massey algorithm. The Berlekamp-Massey algorithm is described in such treaties as the aforementioned.

Prior art circuits for solving the Berlekamp-Massey algorithm, and hence for obtaining the coefficients of the error locator polynomial, typically comprise a bank of n−K m-bit shift registers for storing therein a serially input sequence of synromes; a bank of n−K+1 shift registers wherein coefficients of the locator polynomial are accumulated; a plurality of multipliers and an adder connected in a convolution circuit to operate on the values stored in the bank of syndrome shift registers and on the values stored in the bank of coefficient registers to obtain a current discrepancy $d_n$; a register for obtaining a prior discrepancy $d_m$; a ROM having stored therein a look-up table or the like for performing an inverse operation on the prior discrepancy to obtain a multiplicative inverse $d_m^{-1}$ of the prior discrepancy; a multiplier for multiplying the current discrepancy $d_n$ by the inverse $d_m^{-1}$ of the prior discrepancy, multipliers for selectively multiplying the product $d_n d_m^{-1}$ by the prior contents of registers included in the bank of coefficient registers; and, adders for accumulating the product of the last-mentioned multiplication in the bank of coefficient registers.

Although the prior art circuit described in the preceding paragraph advantageously employs combinatorial finite field multipliers to reduce the number of circuit elements required by earlier vintage circuits, three sets of clock cycles are required in order to perform the three multiplication operations performed thereby. These three multiplication operations are the multiplication effected by the convolution circuit; the multiplication of the current discrepancy by the multiplicative inverse of the prior discrepancy to obtain the product $d_n d_m^{-1}$; and, the multiplication of the product $d_n d_m^{-1}$ by the prior contents of the coefficient registers.

The prior art decoding circuit described above operates on syndromes having what has traditionally been called a "conventional basis" or "alpha basis" representation. In the conventional basis representation of message data, with the message data being a sequence of binary bits, the least significant bit is interpreted as the coefficient of $\alpha^0$, the next most significant bit as the coefficient of $\alpha^1$, the next most significant bit as the coefficient of $\alpha^2$, and so on where $\alpha$ is an element of a finite field.

As explained in U.S. Pat. No. 4,410,989 to Berlekamp, incorporated herein by reference, a "dual basis" representation, also known as a "beta basis" representation, can also be used to represent message data. The dual basis representation is related to the conventional basis representation by the following set of equations:

$$Tr(\alpha^j\beta_i) = \begin{cases} 1 \text{ if } i = j \\ 0, \text{ otherwise} \end{cases}$$

where the trace function $$Tr(X) = x + x^2 + x^{22} + \ldots + x^{2^{m-1}}$$

is in the finite Galois Field GF ($2^m$) of which x is an element.

The afore-referenced U.S. Pat. No. 4,410,989 to Berlekamp discloses a bit serial encoder wherein redundancy bits are realized by a bit serial multiplicative procedure. The Berlekamp '989 patent essentially teaches, for an encoding process, the utilization of representations in dual bases for a multiplier which multiplies by a constant to have a serial output. The Berlekamp '989 patent does not show circuitry for utilizing dual basis representations to obtain the coefficients of an error locator polynomial in a decoding process.

A Reed-Solomon code has minimum distance $d_{min} = n - K + 1$ and is capable of simultaneously correcting v number of errors and e number of erasures where $2v + e < d_{min}$. An erasure is an error whose location is known but whose magnitude is not.

An erasure locator polynomial $\lambda(X)$ is definable thusly $$\lambda(X) = \prod_{i=1}^{e} (X - \alpha^{ei}) = \sum_{i=0}^{e} \lambda_i X^{e-i}$$

where e is the number of erasures (i.e., number of pointers presented) in a codeword. It has been shown by D. O. Carhoun et al (Carhoun, D. O., Johnson, B. L., and Meehan, S. J., "Transform Decoding of Reed-Solomon Codes Volume I: Algorithm and Signal Processing Structure," ESD-TR-82-403, Volume I, November 1982) that, with known $\alpha^{el}$, a structure to implement the Berlekamp-Massey Algorithm can also be used to generate the elementary symmetric functions of the erasure locations ($\lambda_i$), and that by initializing the Berlekamp-Massey Algorithm with these values the algorithm will produce the elementary symmetric functions of error/erasure locations.

In view of the foregoing, it is an object of the present invention to provide method and apparatus for efficiently obtaining the coefficients of an error/erasure locator polynomial in a decoding process.

An advantage of the present invention is the provision of an error/erasure locator circuit usable for efficiently obtaining both the coefficients of an error/erasure locator polynomial and modified syndromes usable for obtaining the magnitudes of errors and erasures.

Another advantage of the present invention is the provision of error/erasure location apparatus and method wherein a cascading multiplier arrangement is utilized to perform three multiplication operations in two rather than three sets of clock cycles in connection with the determination of coefficients of an error/erasure polynomial.

Another advantage of the present invention is the provision of a decoder not requiring a shift register for interfacing a syndrome generator and circuitry used for obtaining the coefficients of an error/erasure locator polynomial.

A further advantage of the present invention is the provision of an error/erasure locator circuit wherein syndrome registers are usable for the dual function of storing both syndrome values and computing modified syndromes usable for obtaining the magnitudes of errors and erasurers.

A yet further advantage of the present invention is the provision of a circuit which uses elementary symmetric functions of the error locations for initialization of the Berlekamp-Massey Algorithm in order to produce the elementary symmetric functions of error/erasure locations.

SUMMARY

A decoder processes codewords in pipeline fashion. During a given codeword cycle, a syndrome generator operates on codeword n, an error/erasure locator operates on codeword n−1, and a root search and error/erasure magnitude generator operates on codeword n−2.

At the error/erasure locator each codeword cycle comprises (n−K) "coefficient" iterations followed by (n−K) "modified syndrome" iterations. Completion of all coefficient iterations yields coefficients of an error/erasure locator polynomial. Completion of the modified syndrome iteration yields modified syndromes usable for obtaining the magnitudes of errors and erasures. Each coefficient iteration requires two sets of clock cycles or clock pulses; each modified syndrome iteration requires one set of clock cycles or clock pulses.

The error/erasure locator circuit includes a plurality of simultaneously loadable syndrome registers and a plurality of coefficient registers. The syndrome registers are connected to one another in a circular shift path.

During a first set of clock cycles of a coefficient iteration, a convolution circuit comprised of a first bank of a plurality of parallel-in, serial-out (PISO) multipliers operates upon the contents of the syndrome registers (expressed in a conventional basis representation) and the contents of the coefficient registers (expressed in a dual basis representation) to obtain a serial current discrepancy $d_n$ (expressed in dual basis representation). A serial-in, parallel-out (SIPO) multiplier is employed to multiply the serial current discrepancy $d_n$ by a parallel-formatted multiplicative inverse $d_m^{-1}$ of a prior discrepancy expressed in dual basis representation and to thereby obtain the product $d_n d_m^{-1}$.

A plurality of basis converters, designed to reflect operation of a particular generator polynomial employed for the encoding/decoding procedure, convert the contents of certain ones of the coefficient registers so that these contents are expressed in the conventional basis representation. A special counter circuit is used to determine whether the conventionally-expressed contents of the coefficient registers is to be loaded into associated auxiliary registers. A second bank of PISO multipliers multiplies the contents of auxiliary registers by the contents of a special register to obtain a serial product. In some iterations the contents of the special register is the product $d_n d_m^{-1}$. Associated with each PISO multiplier in the second bank is an accumulator which accumulates successive serial products generated by the PISO multiplier and which loads an accumulated value expressed in dual bass representation into an associated coefficient register.

The PISO multipliers included in the convolution circuit essentially obtain the inner product of the contents of the syndrome registers and the contents of the coefficient registers. The contents of each coefficient register, unlike the contents of the syndrome registers, is expressed in a dual basis representation. To this end, each PISO multiplier included in the first bank includes a multiplication feedback loop for the coefficient register as well as logical AND and XOR gates for obtaining the inner product. The feedback loop includes a multiplier for multiplying the contents of the coefficient by a field element $\alpha$, so that the original contents of the coefficient register can ultimately be multiplied by powers of field element $\alpha$.

As mentioned above, during a first set of clock cycles the serial output of the convolution circuit is multiplied by the parallel-formatted multiplicative inverse $d_m^{-1}$ of a prior discrepancy. The multiplication is accomplished using a SIPO multiplier to obtain the discrepancy product $d_n d_m^{-1}$. During a second set of clock cycles the discrepancy product $d_n d_m^{-1}$ is further multiplied using PISO multipliers by the conventionally-expressed contents of various ones of the coefficient registers to result in a serial product which is accumulatable for revising the contents of the coefficient registers. Thus, a PISO-SIPO-PISO cascading multiplier arrangement is utilized for a decoding process and achieves three multiplication operations in two sets of clock cycles.

Upon the completion of each coefficient iteration the contents of the syndrome registers are shifted clockwise along the syndrome's circular shift path. The clockwise shifting of the contents of the syndrome registers occurs for $n-K$ coefficient iterations until the lowest order syndrome value $S_o$ reaches the highest order syndrome register. Upon completion of the $n-K$ coefficient iterations, the coefficients of the error/erasure locator polynomial are stored in the coefficient registers. The error/erasure locator circuit then commences the execution of $n-K$ modified syndrome iterations.

During each modified syndrome iteration, an inner/product is obtained between various pairs of syndrome registers and coefficient registers. After each modified syndrome iteration, the contents of the syndrome registers are shifted counter-clockwise along the syndrome circular path and the previously-obtained inner product value, which is a modified syndrome, is loaded into the highest order syndrome register. Thus, upon completion of $n-K$ modified syndrome iterations, the modified syndromes are all stored in the syndrome registers. In this manner the syndrome registers perform the dual purpose of storing the original syndromes during the coefficient iteration and storing the modified syndromes during the modified syndrome iteration, thereby obviating the need for further registers.

BRIEF DESCRIPTION OF THE DRAWINGS

The foregoing and other objects, features, and advantages of the invention will be apparent from the following more particular description of preferred embodiments as illustrated in the accompanying drawings in which reference characters refer to the same parts throughout the various views. The drawings are not necessarily to scale, emphasis instead being placed upon illustrating the principles of the invention.

FIG. 1 is a schematic view showing a block diagram which depicts a general scheme of error correction decoding including a decoder;

DETAILED DESCRIPTION OF THE DRAWINGS

Figure 2A:
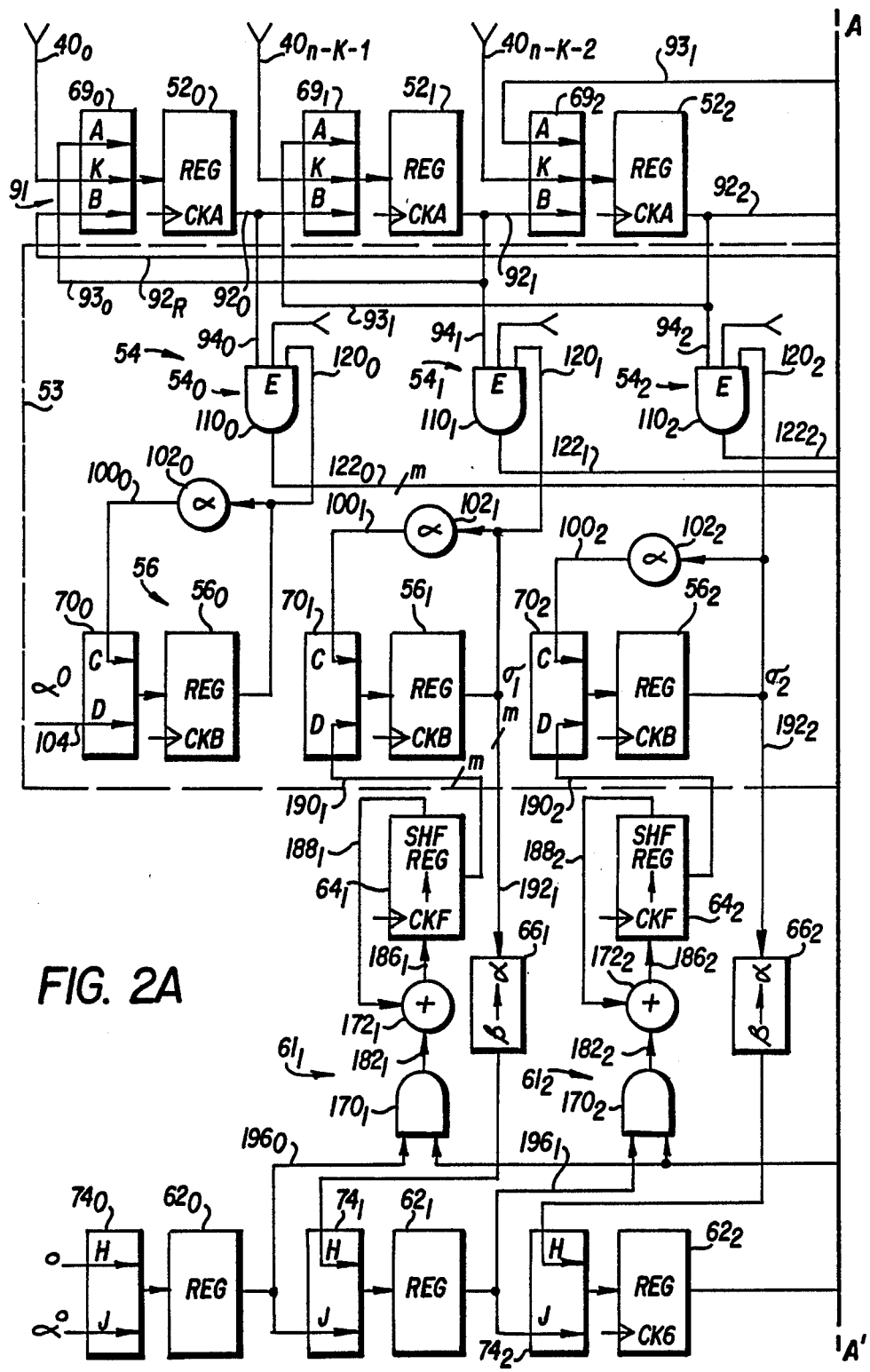
FIGS. 2A and 2B comprise a schematic view of an error/erasure locator circuit according to an embodiment of the invention for, inter alia, determining coefficients of an error/erasure locator polynomial.

FIG. 1 schematically illustrates structure involved with the decoding of information generally, and particularly illustrates the decoding of codewords stored on a medium such as magnetic tape 20. FIG. 1 shows a conventional reader head 22 and conventional channel signal processing circuitry 24 in addition to a decoder 26. The channel signal processor 24 is of a known type which generates an m-bit data signal on data bus 27; an erasure pointer signal on line 2S; and, a codeword reset signal (CODEWORD RST) on line 29. The decoder 26 shown in FIG. 1 operates particularly on Reed-Solomon codewords containing "n" number of m-bit symbols, the n number of symbols including K number of informational symbols and $n-K$ number of check signals.

The decoder 26 includes a syndrome generator 30; an erasure location value generator 31; an error/erasure locator 32; a root search and error/erasure magnitude generator 34; a FIFO buffer 36; an adder 38; and, a timer/controller 39. The decoder 26 also includes a plurality of buses. A syndrome bus 40 (including $(n-K)$ m-bit leads) connects output ports of the syndrome generator 30 to syndrome registers included in the error/erasure locator 32. An m-bit erasure location value bus 42 connects output ports of the erasure location value generator 31 to the error/erasure locator 32. A coefficient bus 44 including (n−K) m-bit leads connects coefficient registers included in the error/erasure locator 32 to the root search and error/erasure magnitude generator 34. A modified syndrome bus 46 including (n−K) m-bit leads also connects the error/erasure locator 32 to the root search and error/erasure magnitude generator 34.

The erasure location value generator 31 receives the pointer signal from the signal processor 24 on line 28 and generates erasure location values for transmission on bus 42 to the error/erasure locator 32. The syndrome generator 30 receives the data signal from the signal processor 24 on bus 27 and generates the syndrome characters $S_{n-K-1}, \ldots S_1, S_0$. The syndrome characters are transmitted in parallel on bus 40 to the error/erasure locator 32. Using the syndrome characters and the erasure location values, the error/erasure locator 32 calculates the coefficients of the error/erasure locator polynomial and the modified syndrome values used for obtaining the magnitude of errors and erasures. The coefficients of the error/erasure locator polynomial on bus 44 and the modified syndrome values on bus 46 are then applied to the root search and error/erasure magnitude generator 34.

Figure 8:
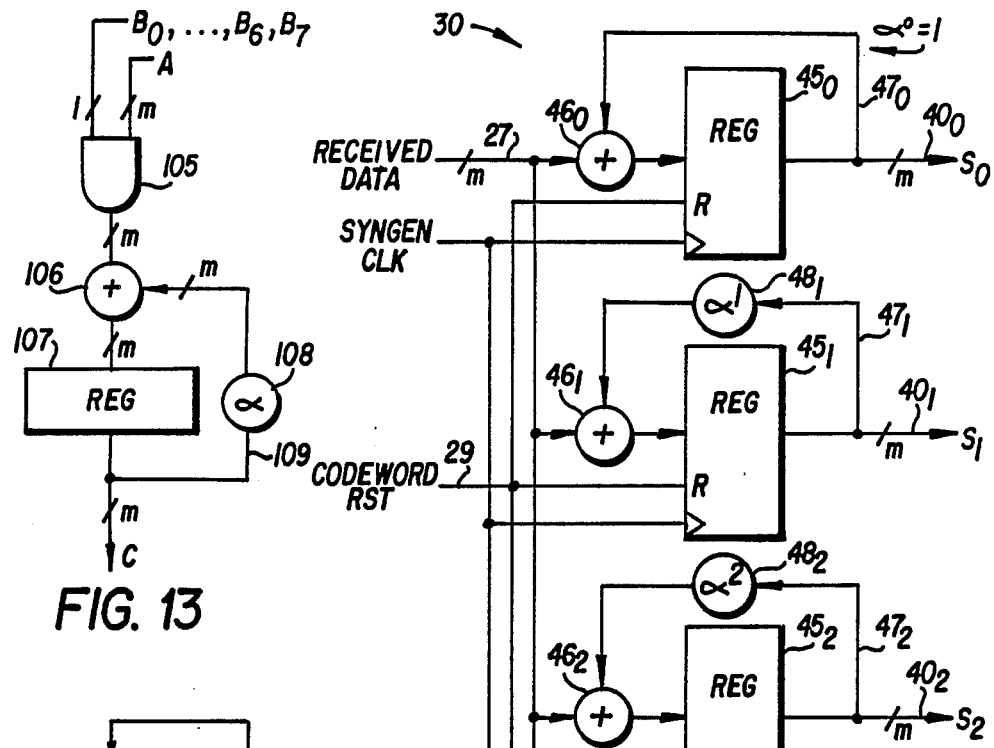
FIG. 8 is a schematic view of a syndrome generator circuit according to an embodiment of the invention.

The syndrome generator 30, shown in FIG. 8, comprises n−K number of registers $45_0, 45_1, \ldots 45_{n-K-1}$ for generating syndromes $S_0, S_1, \ldots S_{n-K-1}$, respectively. Each register 45 is resetable by virtue of its connection to line 29 for CODEWORD RST. Each register 45 is connected to line SYNGEN CLK for timing purposes. Each register 45 has its data input port connected to an adder 46 and its data output port connected by a feedback loop 47 to the adder 46. Other than the first feedback loop $47_0$, each feedback loop 47 has a multiplier 48 provided thereon. The multiplier $48_1$ is used to multiply the contents of register $45_1$ by the first power of field element $\alpha$; the multiplier $48_2$ is used to multiply the contents of register $45_2$ by the second power of field element $\alpha$(i.e., by $\alpha^2$); and so on. The product of the feedback loop multiplication is added to the received data on bus 27 inasmuch as the adders 46 have input terminals connected both to the bus 27 and to their associated feedback loops.

Figure 2B:
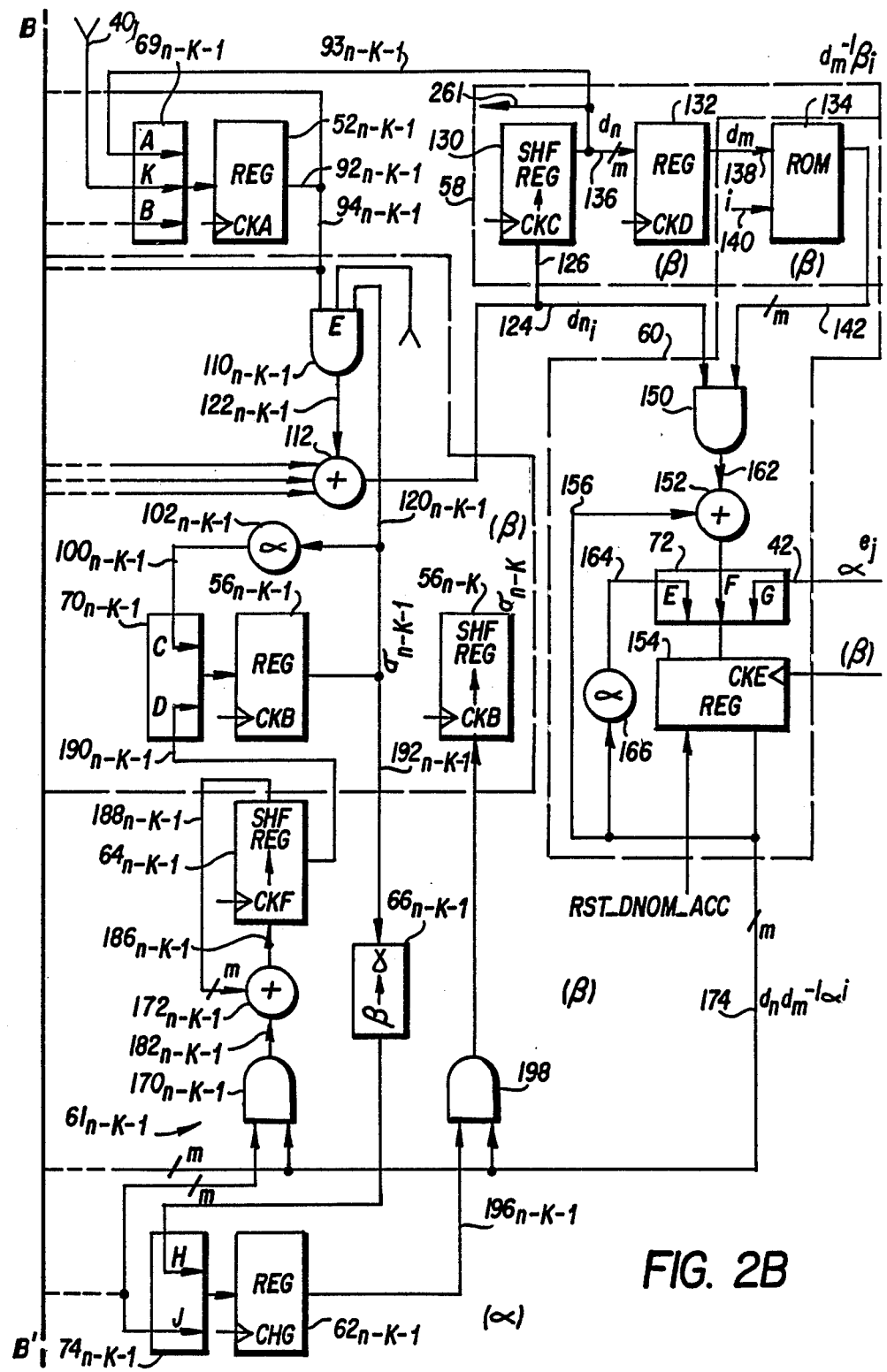

The error/erasure locator 32 (which determines inter alia coefficients of the error/erasure locator polynomial) is shown in FIG. 2 as including a bank 52 of syndrome registers $52_0$-$52_{n-K-1}$; a convolution circuit 53 including a first bank 54 of PISO (parallel-in, serial out) multipliers $54_0$-$54_{n-K-1}$; a bank 56 of coefficient registers $56_0$-$56_{n-K}$; a prior discrepancy generator 5S; a SIPO (serial-in, parallel-out) multiplier 60; a second bank 61 of PISO multipliers $61_1$-$61_{n-K}$; a bank 62 of auxiliary registers $62_0$-$62_{n-K-1}$; a bank 64 of accumulators $64_1$-$64_{n-K-1}$; and, a bank 66 of basis converters $66_1$-$66_{n-K-1}$.

The error/erasure locator 32 also includes a first bank 69 of multiplexers $69_0, 69_1 \ldots 69_{n-K-1}$; a second bank 70 of multiplexers $70_0, 70_1, \ldots 70_{n-K-1}$; multiplexer 72; and, a third bank 74 of multiplexers $74_0, 74_1, \ldots 74_{n-K-1}$. Each multiplexer in the first bank is associated with a corresponding one of the syndrome registers in bank 52 to control the selection of input data to the corresponding syndrome register. Likewise, each multiplexer in the second bank 70 is associated with a corresponding one of the coefficient registers in bank 56 to control the selection of input data to the corresponding syndrome register. Similarly, each multiplexer in the third bank 74 is associated with a corresponding one of the auxiliary registers in bank 62 to control the selection of input data to the corresponding auxiliary register.

Under the supervision of the timer/controller 39 each multiplexer included in the error/erasure locator 32 connects the data input port of its associated register with a selected one of a plurality of input options. The input options for each multiplexer are alphabetically labelled in FIG. 2 to correspond with similarly referenced enablement signals generated by the timer/controller 39. For example, the multiplexers in bank 52 each have input options A, K, and B, which are active upon the generation by timer/controller 39 of the respective signals ENA-A; ENA-K, and ENA-B. As shown with reference to FIG. 2, multiplexer option enablement signals ENA-A through ENA-F and ENA-I through ENA-K are generated by the timer/controller 39.

The timer/controller is also responsible for generating such signals as a CKA signal (applied to CKA pins of syndrome registers in bank 52); a CKB signal (applied to CKB pins of coefficient registers in bank 56); CKC and CKD signals (applied to pins of the prior discrepancy generator 58); a signal CKE (applied to the CKE pins of the SIPO 60); a signal CKF (applied to CKF pins of the bank 64 of accumulators); a signal CKG (applied to the CKG pins of 62 of auxiliary registers in bank 62); and a signal RST-DNDM-ACC (applied to register 154).

The syndrome registers in bank 52 are connected in a circular shift path 91. The syndrome circular shift path 91 includes a clockwise path 92 (comprising m-bit leads $92_0$-$92_{n-K-1}$) and a counter clockwise path 93 (comprising m-bit leads $93_0$-$93_{n-K-1}$). When the signal ENA-B is generated lead $92_1$ connects the data output port of register $52_0$ to the data input port of register $51_1$ via multiplexer $69_1$, lead $92_2$ connects the data output port of register $52_1$ to the data input port of register $52_2$ via multiplexer $69_2$, and so forth. The data output port of register $52_{n-K-1}$ is connectable by m-bit lead 92R back to the data input port of register $52_0$ via multiplexer $69_0$. When the signals ENA-A and CKA are generated, lead $93_0$ connects the data output port of register $52_1$ to the data input port of register $52_0$ via multiplexer $69_0$, lead 93, connects the data output port of register $52_2$ to the data input port of register $52_1$ via multiplexer $69_1$, and so forth.

The data output ports of the syndrome registers included in bank 52 are also connected by m-bit leads $94_0$ through $94_{n-K-1}$, respectively, to respective PISO multipliers $54_0$ through $54_{n-K-1}$.

The m-bit leads $40_0, 40_1, \ldots 40_{n-K-1}$ in bus 40 are connected to data input ports of the syndrome registers $52_0, 52_1, \ldots 52_{n-K-1}$, respectively, through the respective associated multiplexers $69_0, 69_1, \ldots 69_{n-K-1}$ upon generation of the signal ENA-K. Thus, the syndrome values are applied in parallel to their corresponding syndrome registers in bank 52. In order to implement a desired clockwise circular shift of syndrome values through register bank 52, lead $40_0$ is connected to multiplexer $69_0$ associated with syndrome register $52_0$; lead $40_{n-K-1}$ is connected to multiplexer 691 associated with syndrome register $52_1$; lead $40_{n-K-2}$ is connected to multiplexer $69_2$ associated with syndrome register $52_2$; and so forth so that lead $40_1$ is connected to multiplexer $69_{n-K-1}$ associated with syndrome register $52_{n-K-1}$.

The coefficient registers $56_0$–$56_{n-K-1}$ included in bank 56 each have their data output ports connectable back to their data input ports by means of m-bit feedback loops $100_0$–$100_{n-K-1}$ when signal ENA-C is generated. Each m-bit feedback loop $100_0$–$100_{n-K-1}$ has a respective multiplier 102 provided thereon.

The coefficient registers $56_0$–$56_{n-K}$ included in bank 56 each have their data input ports controlled by an associated one of the multiplexers $70_0$, $70_1$, . . . $70_{n-K-1}$. The multiplexer 70 governs the choice of signal to be applied to the data input port of the coefficient register. For example, the multiplexer $70_0$ applies to the data input port of the coefficient register $56_0$ an initilization value $\alpha^0$ on lead 104 when the signal ENA-D is generated and a feedback value from loop $100_0$ when the signal ENA-C is generated.

As described in more detail hereinafter, the PISO multipliers in bank 54 are included in a cascading arrangement with the SIPO multiplier 60 and the PISO multipliers in bank 61 to perform three multiplication operations in only two sets of clock cycles. The cascading of the PISO multipliers in bank 54 with the SIPO multiplier 60 facilitates the performance of two multiplication operations in just one set of clock cycles. In particular, the cascading of the PISO multipliers in bank 54 with the SIPO multiplier 60 results in both the generation of the current discrepancy $d_n$ and the discrepancy product $d_n d_m^{-1}$ during a first set of clock cycles of a coefficient iteration.

Figure 13:
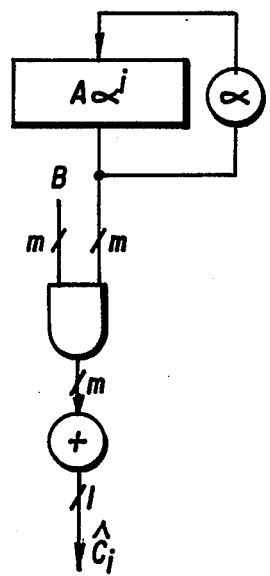
FIG. 13 is a schematic view of a sequential serial-in, parallel-out multiplier operating on inputs expressed in the same basis.

A mathematical basis for the understanding of the cascading of the PISO multipliers in bank 54 and the SIPO multiplier 60 is now provided. In this regard, FIG. 13 shows a sequential serial-in, parallel-out multiplier comprising an AND gate means 105; an adder 106; a register 107; and a multiplier 108 provided on a feedback loop 109. The AND gate means comprises m number of 2-input AND gates. The adder 106 comprises m number of 2-input XOR gates. One of the inputs, A, is applied in parallel and the other input, B, is applied sequentially. After m clocks, the register 107 contains the product, C. The multiplier of FIG. 13 assumes that both inputs A and B are in standard basis representation, i.e., the basis is $\alpha^i$ where $i = 0, 1, \ldots m-1$.

It has been mentioned above that each finite field with generator $\alpha$ has a dual basis representation $\beta$ with $i = 0, 1, \ldots m-1$, and that the dual basis is related to the standard basis by the following set of equations:

$$tr(\alpha^j \beta_i) = \begin{cases} 1, \text{ if } i = j \\ 0, \text{ otherwise} \end{cases}$$

where $tr(x) = x + x^2 + x^{2^2} + \ldots x^{2^{m-1}}$ where $tr(x) = x + x^2 + x^{2^2} + \ldots x^{2^{m-1}}$
in of ($2^m$) (the finite field of which x is an element). Further, $$(x+y)^{2^K} = x^{2^K} + y^{2^K} \text{ for all } K.$$

This implies that $$tr(x+y) = tr(x) + tr(y).$$

Also, if $x \in \{0, 1\}$ then $$x^{2^K} = x$$

which implies that $$tr(xA) = x tr(A).$$

Now, let Z be in $\beta$ representation, then $$Z = \sum_{i=0}^{m-1} Z_i \beta_i$$

NOW, $$Z_j = \sum_{i=0}^{m-1} Z_i tr(\alpha^j \beta_i)$$

because every term in the sum is $\phi$ except when $i = j$. This implies that $$Z_j = tr\left(\sum_{i=0}^{m-1} \hat{Z}_i \alpha^j \beta_i\right)$$

$$= tr\left(\alpha^j \sum_{i=0}^{m-1} \hat{Z}_i \beta_i\right)$$

$$= tr(\alpha^j Z)$$

WHICH FURTHER IMPLIES THAT $$(\alpha Z)_j = tr(\alpha^j (\alpha Z))$$
$$= tr(\alpha^{j+1} Z)$$
$$= \hat{Z}_{j+1}; \text{ FOR } j = 0, 1, \ldots m - 2$$

NOW $(\alpha Z)_{m-1} = tr(\alpha^m Z)$ $$= tr\left(\alpha^m \sum_{i=0}^{m-1} \hat{Z}_i \beta_i\right)$$

$$= tr\left(\sum_{i=0}^{m-1} \hat{Z}_i \beta_i \alpha^m\right)$$

$$= \sum_{i=0}^{m-1} \hat{Z}_i tr(\beta_i \alpha^m)$$

Figure 14:
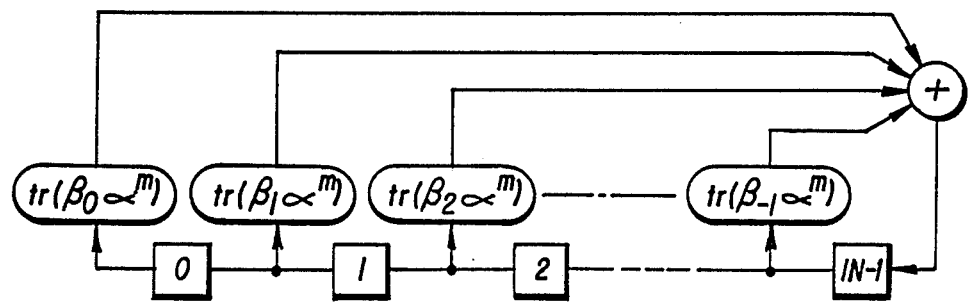
FIG. 14 is a schematic view of a linear feedback shift register used to illustrate the derivation of a parallel-in, serial-out multiplier according to an embodiment of the invention.

Therefore, if Z is in $\beta$ representation, then the linear feedback shift register of FIG. 14 can be used to produce $\alpha Z$.

If the register of FIG. 14 initially contains Z, then after one clock the register will contain $\alpha Z$. If $Z = XY$, where X is in $\alpha$ representation and Y is in $\beta$ representation, then $$Z_i = tr(\alpha^i XY)$$

$$= tr(X(\alpha^i Y))$$

$$= tr\left(\sum_{j=0}^{m-1} X_j \alpha^j \sum_{k=0}^{m-1} (\alpha^i Y)_k \beta_k\right)$$

$$= \sum_{j=0}^{m-1} \sum_{k=0}^{m-1} X_j (\alpha^i Y)_k tr(\alpha^j \beta_k)$$

$$= \sum_{j=0}^{m-1} X_j (\alpha^i Y)_j$$

Therefore, the $i_{th}$ bit of the product, $XY$, is the inner product of $X$ and $\alpha^i Y$, and hence the product can be produced serially.

Figure 15:
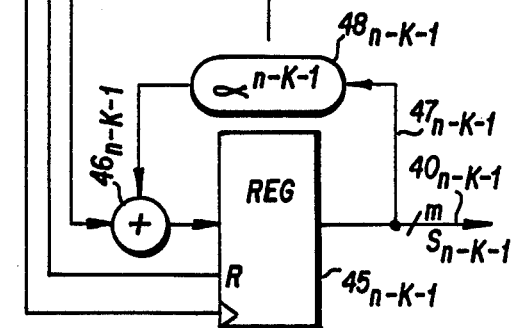
FIG. 15 is a schematic view of a parallel-in, serial-out multiplier according to an embodiment of the invention; and, FIG. 16 is a schematic view of a multiplier which has a serial input and which operates on operands which are in a second basis representation.

FIG. 15 shows a parallel-in, serial-out multiplier, wherein a register is initially loaded with "A" and the output of the multiplier is "Co" with each clock the next bit of the product is produced. Input "A" is in $\beta$ representation and input "B" is in $\alpha$ representation.

Figure 16:
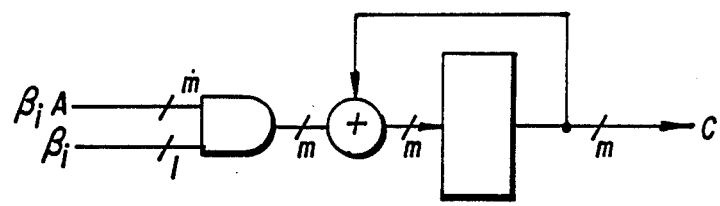

In view of the foregoing, if a first multiplier with a serial output feeds a second multiplier with a serial input, then two multiplications could occur simultaneously, i.e., in m number of clock pulses. Thus, a PISO multiplier followed by a SIPO multiplier can produce the product (AXB)XC in m number of clock pulses. However, the structure of the SIPO multiplier relies on the fact that, for the standard basis, $\alpha_i = \alpha_i$ where $i=0, 1, \ldots m-1$ and so $\alpha_{i+1} = \alpha \cdot \alpha_i$ for $(i=0, 1, \ldots m-1)$. Thus, what is needed is a multiplier structure which has a serial input and which operates on operands which are in $\beta$ representation. FIG. 16 illustrates such a multiplier, it being observed that the parallel input is $\beta_i A$ instead of A. The error erasure locator circuit 32 of the present invention utilizes PISO multipliers similar to FIG. 15 and a SIPO multiplier 60 which resembles the multiplier of FIG. 16 as derived in the foregoing manner) and cascades the two types of multipliers together to perform two multiplication operations in a single set of clock cycles.

Figure 3:
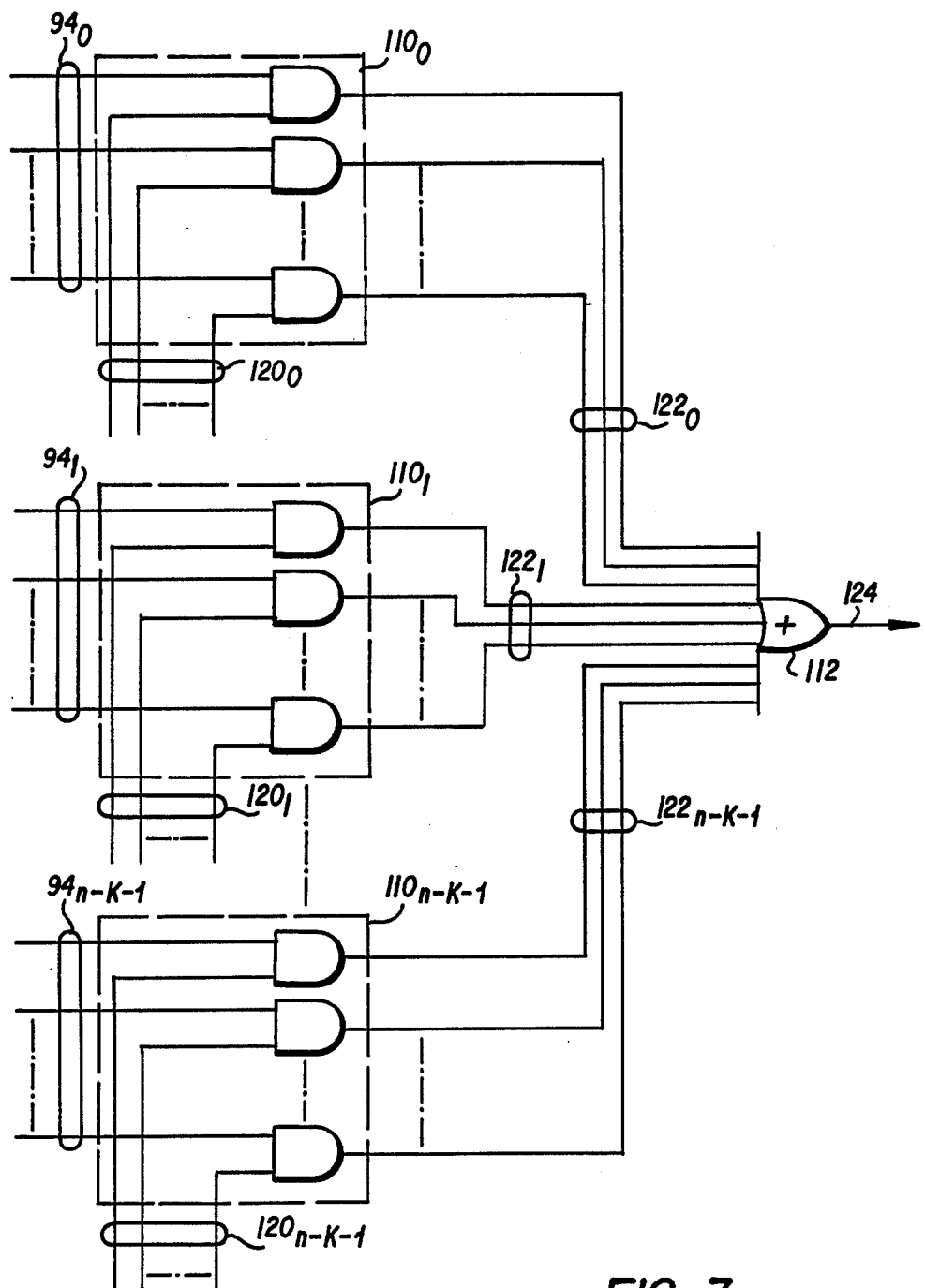
FIG. 3 is a schematic view of portions of a first bank of PISO multipliers included in an error/erasure locator circuit according to an embodiment of the invention.

The convolution circuit (framed by broken line 53) comprises PISO multipliers $54_0$-$54_{n-K-1}$ included in bank 54. Each PISO multiplier included in the bank 54 includes one of the coefficient registers in bank 56 and its associated feedback loop; one of a plurality of logical AND gate means $110_0$-$110_{n-K-1}$; and, an adder 112 shared in common by each of the PISO multipliers included in bank 54. Each feedback loop 100 has a multiplier 102 provided thereon, the structure of the multiplier 102 being understood with reference to FIG. 7 for a particular generator polynomial. As shown in FIG. 3, each logical AND gate means 110 comprises m number of AND gates, each AND gate receiving input bits of the same order from leads 94 and 120.

The input terminals of the logical AND gate means 110 are connected to the data output port of the associated syndrome register 52 by the m-bit lead 94 and to the data output port of the associated coefficient register by m-bit lead 120. Each AND gate means $110_0 110_{n-K-1}$ has an enablement pin E which receives a signal from the controller/timer 39 when the AND gate is to be activated. The output terminals of each logical AND gate means $110_0$-$110_{n-K-1}$ is connected by an associated m-bit lead $122_0$-$122_{n-K-1}$, respectively, to input terminals of the adder 112.

As also shown in FIG. 3, the adder 112 is a logical exclusive OR (XOR) gate which performs a logical XOR operation with respect to the $n-K$ number of incoming values expressed on the m-bit leads $122_0$-$122_{n-K-1}$. The output terminal of the adder 112 is connected by a 1-bit line 124 to the SIPO multiplier 60 and by a 1-bit line 126 to the prior discrepancy generator 58.

In light of the foregoing, it is seen that convolution circuit 53 functions to multiply the contents of a syndrome register with its paired coefficient register, to obtain a product using the logical AND gate means, and to sum all such products similarly obtained with respect to each register pair using the adder 112. The output of the adder 112 is thus the inner product of the contents of the bank 52 of syndrome registers and the bank 56 of coefficient registers, associated ones of the registers having been paired according to related subscripts. The output from adder 112 is a bit $d_{ni}$, which becomes part of a serial bit stream which is known as the current discrepancy (where i indexes from o to m−1).

The prior discrepancy generator 58 comprises a serial-to-parallel shift register 130; a prior discrepancy determination register 132; and, a read-only memory (ROM) 134 utilized to determine a product $d_m{}^{-1}\beta hd$ i which includes the multiplicative inverse $d_m{}^{-1}$ of the prior discrepancy. The shift register 130 receives the serial bit stream format of the current discrepancy $d_n$ on 1-bit line 126 and, during successive clock signals, converts this current discrepancy $d_n$ from a serial format to a parallel format. The m output pins of the shift register 130 are connected by lead $93_{n-K-1}$ to the syndrome register $52_{n-K-1}$ via the multiplexer $69_{n-K-1}$ and by an m-bit lead 136 to the input pins of the prior discrepancy determination register 132. Register 132 uses the current discrepancy $d_n$ to determine a prior discrepancy $d_m$ in accordance with conventional practice. The parallel formatted prior discrepancy is transmitted on m-bit lead 138 to the ROM 134.

The ROM 134 has stored therein a look-up table for obtaining the multiplicative inverse product $d_m{}^{-1}\beta_i$ of the prior discrepancy. The manner in which data is stored in the look-up table of ROM 134 is hereinafter described with reference to FIG. 12. An appropriate value in the look-up table is addressable using the prior discrepancy value applied by lead 138 and by an index value i applied on lead 140. The value i indexes from $i=0$ to $m-1$ during successive clock cycles. The ROM 134 is connected to the SIPO multiplier 60 by an m-bit lead or bus 142.

Figure 4:
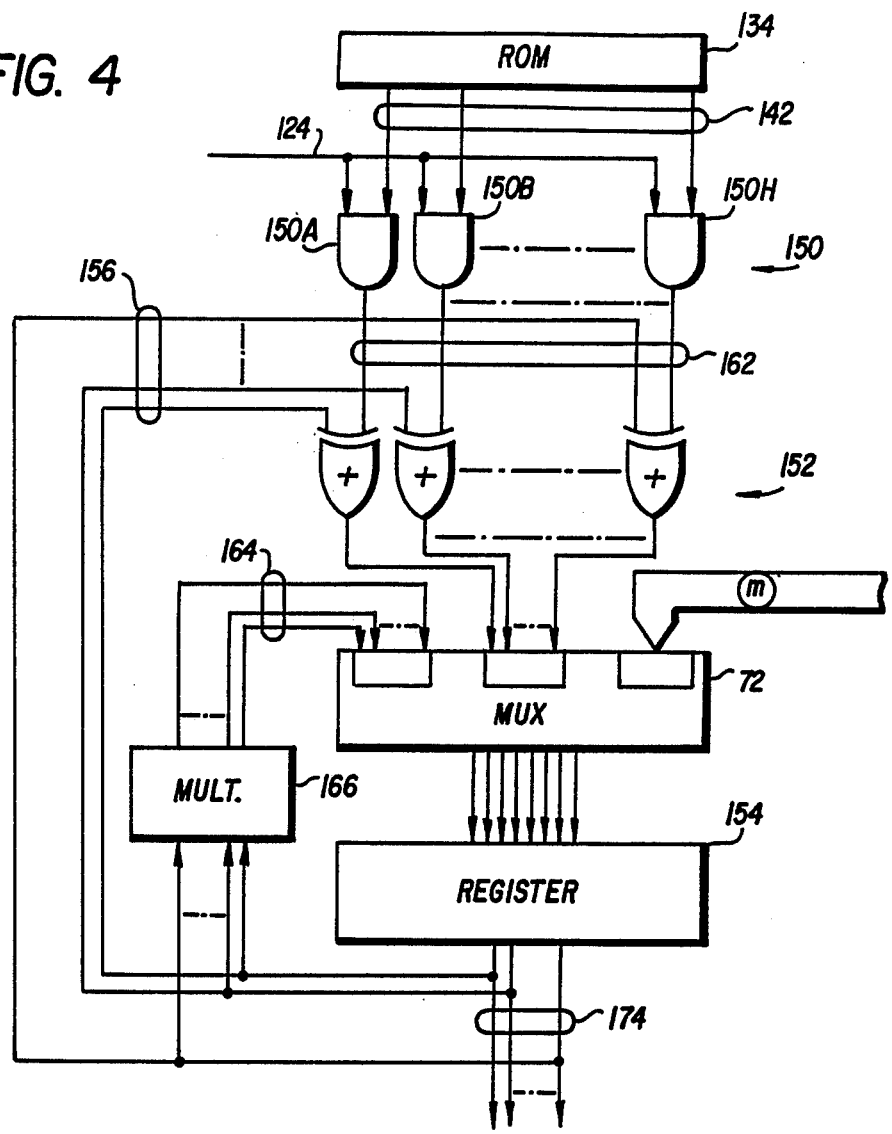
FIG. 4 is a schematic view of a portion of a SIPO multiplier included in an error/erasure locator circuit according to an embodiment of the invention.

The SIPO multiplier 60 comprises the ROM 134; logical AND gate means 150; an adder 152; a special register or discrepancy product register 154; and, means 156 for applying the contents of the register 154 to input terminals of the adder 152. As shown in more detail in FIG. 4, the logical AND gate means 150 comprises eight AND gates 150A-150H. The 1-bit line 124 carrying the current discrepancy $d_n$ is connected to first input terminals for each of the AND gates 150A-150H. Second input terminals of the AND gates 150A-150H are connected to unique lines included in the m-bit lead 142 carrying multiplicative inverse product $d_{m-1}\beta_i$ of the prior discrepancy. The means 156 for applying the contents of register 154 to input terminals of the adder 152 comprise an m-bit lead which connects the data output port of the register 154 to the adder 152. The adder 152 comprises m number of 2-input logical exclusive OR (XOR) gates.

The multiplexer 72 controls which of a plurality of possible data signals are applied to data input terminals of the discrepancy product register 154. In this regard, the multiplexer 72 can connect the data input terminals of the register 154 either: (1) to the output terminal of adder 152 when signal ENA-F is generated; (2) to a feedback loop 164 when signal ENA-E is generated; or (3) to erasure location bus 42 when signal ENA-G is generated. The feedback loop 164 has a multiplier 166 provided thereon whereby, when the multiplexer 72 selects the feedback loop 164, the multiplexer 166 multiplies the contents of register 154 by a field element $\alpha$ so that the product can be loaded into the register 154.

The second bank 61 of PISO multipliers includes the $n-K$ PISO multipliers $61_1, 61_2, \ldots 61_{n-K-1}$. Each PISO multiplier included in bank 61 shares the discrepancy product register 154 together with feedback loop 164 and multiplier 166 provided thereon, and further comprises a respective one of a plurality of logical AND gate means $170_1-170_{n-K-1}$ and a respective one of a plurality of adders $172_1-172_{n-K-1}$. The structure of the multiplier 166 is understood from FIG. 7 with reference to one particular generator polynomial. An m-bit lead 174 connects the data output port of discrepancy product register 154 to appropriate input terminals of each of the logical AND gate means $170_1-170_{n-K-1}$.

Figure 5:
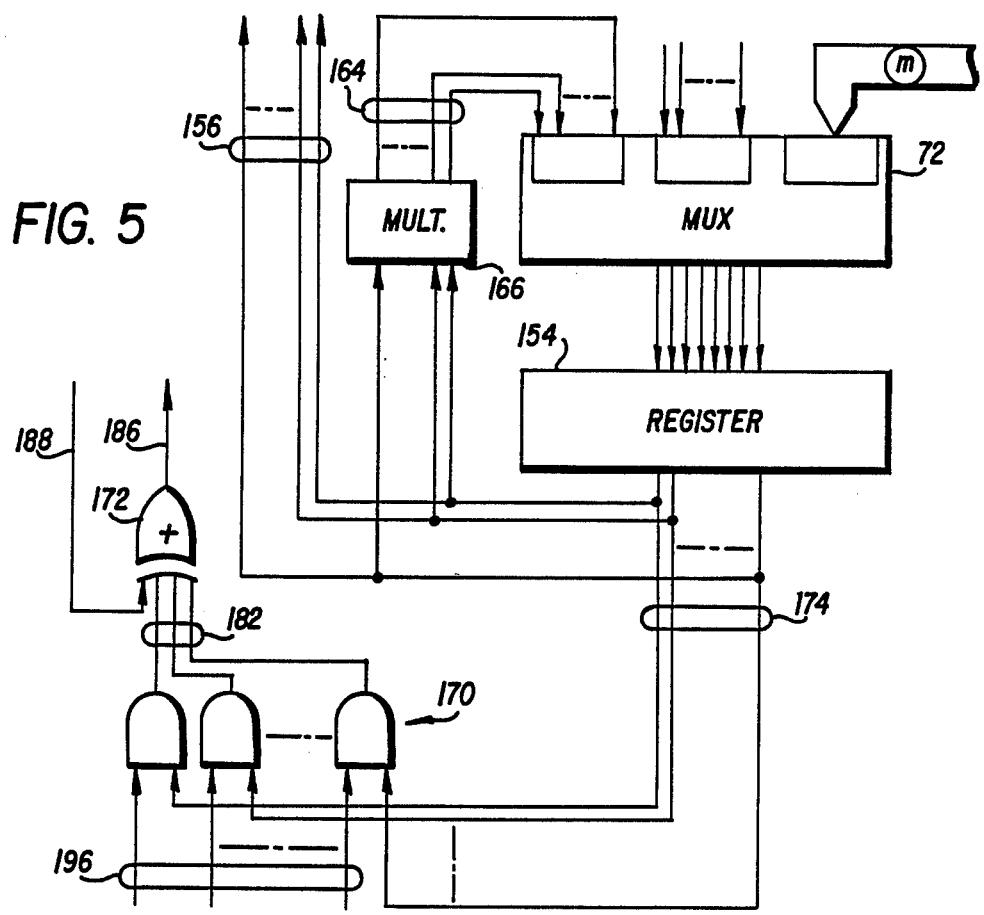
FIG. 5 is a schematic view of a PISO multiplier included in a second bank of multipliers included in an error/erasure locator circuit according to an embodiment of the invention.

FIG. 5 shows in detail one such PISO multiplier included in bank 61. From FIG. 5 it is understood that each logical AND gate means comprises m number of AND gates. FIG. 5 also shows the connection of input terminals of the logical AND gate means $170-170_{n-K-1}$ to the m-bit lead 174. The output terminals of each logical AND gate means is connected by lead 182 to the input terminals of its associated adder 172. As also shown in FIG. 5, each of the adders $172_1$, $172_2$, ... $172_{n-K-1}$ comprise a logical exclusive OR (XOR) gate. An output terminal of each adder is connected by a respective one of the lines $186_1$, $186_2$, ... $186_{n-K-1}$ to an associated one of the accumulators $64_1$, $64_2$ ... $64_{n-K-1}$, respectively.

Each accumulator $64_1$, $64_2$, ... $64_{n-K-1}$ is a serial-to-parallel shift register having its data output port connected by a respective one of m-bit leads $188_1$, $188_2$ ... $188_{n-K-1}$ to input terminals of the respective adders $172_1$, $172_2$, ... $172_{n-K-1}$. In addition, the data output ports of the register $64_1$, $64_2$, ... $64_{n-K-1}$ are connectable under the control of multiplexers $70_1$, $70_2$ ... $70_{n-K-1}$, respectively, by m-bit leads $190_1$, $190_2$, ... $190_{n-K-1}$, respectively, to data input ports of the associated coefficient registers $56_1$, $56_2$, ... $56_{n-K-1}$.

The data output ports of the coefficient registers $56_1$, $56_2$, ... $56_{n-K-1}$ are connected by m-bit leads $192_1$, $192_2$, ... $192_{n-K-1}$, respectively, to input terminals of associated basis converter circuits $66_1$, $66_2$, ... $66_{n-K-1}$. As explained herein, the structure of the basis converter circuits 66 is dependent upon the particular generator polynomial employed in the encoding and decoding process. That is, the structure of the basis converter circuits 66 is specially constructed for each generator polynomial to provide the desired results.

Output terminals of the basis converter circuits $66_1$, $66_2$, ... $66_{n-K-1}$ are connectable, under the control of multiplexers $74_1$, $74_2$, ... $74_{n-K-1}$, during the generation of signal ENA-H, to the data input ports of auxiliary registers $62_1$, $62_2$, ... $62_{n-K-1}$, respectively. The data input ports of the auxiliary registers $62_1$, $62_2$, ... $62_{n-K-1}$ are also connectable, under the control of multiplexers $74_1$, $74_2$, ... $74_{n-K-1}$, respectively, during the generation of signal ENA-J, to data output ports of auxiliary registers $62_0$, $62_1$, ... $62_{n-K-2}$, respectively. The data output ports of auxiliary registers $62_0$, $62_1$, ... $62_{n-K-1}$ are connected by m-bit leads $196_0$, $196_1$, ... $196_{n-K-2}$, respectively, to the PISO multipliers $61_1$, $61_2$, ... $61_{n-K-1}$, respectively, and particularly to the logical AND gates means included in the PISO multipliers. The data output port of auxiliary register $62_{n-K-1}$ is connected by m-bit lead $196_{n-K-1}$ to logical AND gate means 198. The output terminal of logical AND gate means 198 is, in turn, connected to the coefficient register $56_{n-K}$.

As mentioned above, the basis converter circuits $66_1$–$66_{n-K-1}$, specially configured in accordance with the particular generator polynomial employed in a given coding/decoding operation. In this regard, each basis converter circuit 66 is required to convert the contents of its associated coefficient register 56 from a second or dual basis representation to a first basis representation. This requirement is imposed by the utilization of PISO multipliers 61, which require a first basis-represented input from auxiliary registers 62 and a second basis-represented input from the product discrepancy register 154.

What follows is the derivation of the configuration of a basis converter circuit 66 for one particular illustrative generator polynomial, namely $$G(X) = X^8 + X^4 + X^2 + 1,$$

from which it is understood that $$\alpha^8 = \alpha^4 + \alpha^3 + \alpha^2 + 1.$$

As explained above, the relationship between two bases of representation is provided by the trace function, so that for the illustrative generator polynomial $$\begin{aligned}
tr(\beta_j\alpha^8) &= tr(\beta_j\alpha^4 + \beta_j\alpha^3 + \beta_j\alpha^2 + \beta_j) \\
&= tr(\beta_j\alpha^4) + tr(\beta_j\alpha^3) + tr(\beta_j\alpha^2) + tr(\beta_j\alpha^0) \\
&= \begin{cases} 1, & i = 0, 2, 3, \text{ or } 4 \\ 0, & i = 1, 5, 6, \text{ or } 7 \end{cases}
\end{aligned}$$

Figure 7:
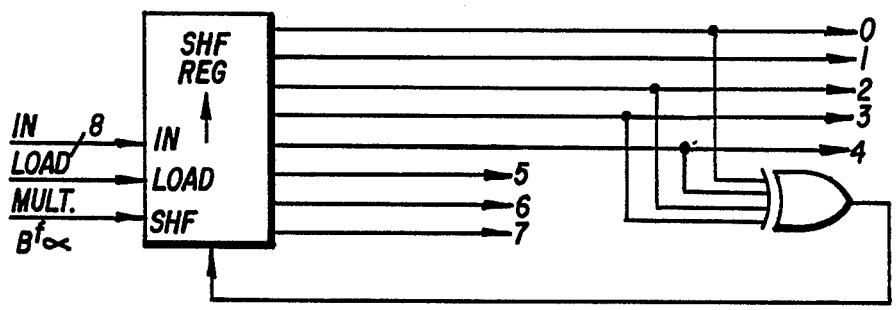
FIG. 7 is a schematic view of a shift register circuit useful for the derivation of the basis converter circuit of FIG. 6 and which is also an alpha feedback multiplier according to an embodiment of the invention.

Given the above criteria, the shift register circuit of FIG. 7 can be utilized to represent a register with a first basis (or $\alpha$ basis) feedback when its contents are expressed in a second basis (or $\beta$ basis) representation.

Now, let $$Z = \sum_{i=0}^{m-1} \hat{Z}_i \beta_i$$

where $\hat{Z}_i$ are the components of the $\beta$ representation of $Z$ and let $$Z = \sum_{i=0}^{m-1} Z_i \alpha^i$$

where $Z_i$ are the components of the $\alpha$ representation of $Z$.

It was previously shown that $$\hat{Z}_j = tr(\alpha^j Z)$$

and that if $$Z = \alpha^0 \text{ then } \hat{Z}_j = tr(\alpha^j)$$

Given the foregoing, it can be shown that $$tr(\alpha^0) = tr(\alpha^1) = tr(\alpha^2) = tr(\alpha^3) = tr(\alpha^4) = tr(\alpha^6) = 0$$

and that $$tr(\alpha^5) = 1$$

Therefore, the $\alpha$ representation for $\alpha$ is $$[10000000]^t$$

and the $\beta$ representation for $\alpha^{20}$ is

[0 0 0 0 0 1 0 0]

where the least significant bit (i.e., bit o)is on the left.

FIG. 7, which uses the second basis representation for $\alpha^n$ to produce the $\beta$ representation of $\alpha^{n+1}$, can be used to generate the following table:

| Element | Representation |
|---|---|
| $\alpha^0$ | [0 0 0 0 0 1 0 0] |
| $\alpha^1$ | [0 0 0 0 1 0 0 0] |
| $\alpha^2$ | [0 0 0 1 0 0 0 1] |
| $\alpha^3$ | [0 0 1 0 0 0 1 1] |
| $\alpha^4$ | [0 1 0 0 0 1 1 1] |
| $\alpha^5$ | [1 0 0 0 1 1 1 0] |
| $\alpha^6$ | [0 0 0 1 1 1 0 0] |
| $\alpha^7$ | [0 0 1 1 1 0 0 0] |

(It is also observed that FIG. 7 illustrates the structure of the multipliers 102 and 166 when the above-assumed generator polynomial is employed.) The above table forms a transformation matrix T.

$$T = \begin{bmatrix} 0 & 0 & 0 & 0 & 0 & 1 & 0 & 0 \\ 0 & 0 & 0 & 0 & 1 & 0 & 0 & 0 \\ 0 & 0 & 0 & 1 & 0 & 0 & 0 & 1 \\ 0 & 0 & 1 & 0 & 0 & 0 & 1 & 1 \\ 0 & 1 & 0 & 0 & 0 & 1 & 1 & 1 \\ 1 & 0 & 0 & 0 & 1 & 1 & 1 & 0 \\ 0 & 0 & 0 & 1 & 1 & 1 & 0 & 0 \\ 0 & 0 & 1 & 1 & 1 & 0 & 0 & 0 \end{bmatrix}$$

such that $TA = \hat{A}$ where $A$ is in the first basis and $\hat{A}$ is in the second basis.

Figure 6:
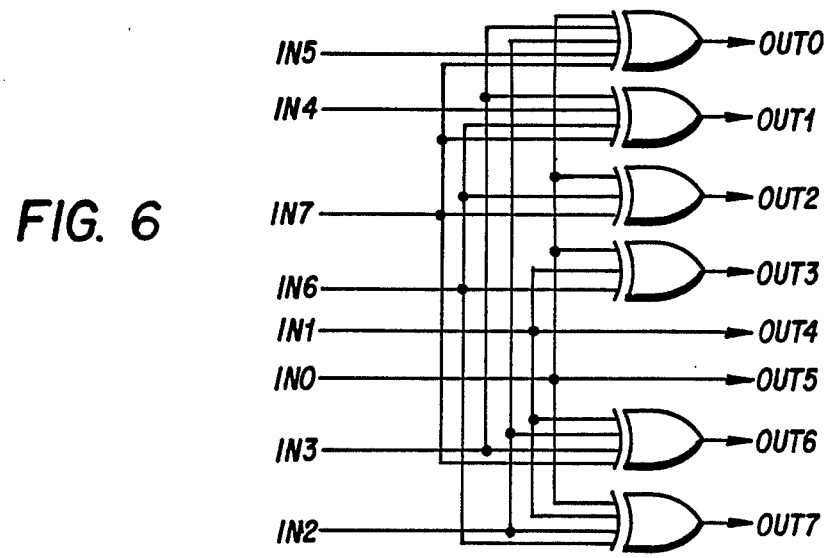
FIG. 6 is a schematic view of an embodiment of a basis converter circuit structured in accordance with one particular generator polynomial.

The following relations are seen from the above matrix:

$\hat{A}_0 = A_5$ $\hat{A}_1 = A_4$ $\hat{A}_2 = A_3 + A_7$ $\hat{A}_3 = A_2 + A_6 + A_7$ $\hat{A}_4 = A_1 + A_5 + A_6 + A_7$ $\hat{A}_5 = A_0 + A_4 + A_5 + A_6$ $\hat{A}_6 = A_3 + A_4 + A_5$ $\hat{A}_7 = A_2 + A_3 + A_4$ From the above relations the following inverse relations are obtained:

$A_0 = \hat{A}_0 + \hat{A}_2 + \hat{A}_3 + \hat{A}_5 + \hat{A}_7$ $A_1 = \hat{A}_3 + \hat{A}_4 + \hat{A}_6 + \hat{A}_7$ $A_2 = \hat{A}_0 + \hat{A}_6 + \hat{A}_7$ $A_3 = \hat{A}_0 + \hat{A}_1 + \hat{A}_6$ $A_4 = \hat{A}_1$ $A_5 = \hat{A}_0$ $A_6 = \hat{A}_1 + \hat{A}_2 + \hat{A}_3 + \hat{A}_7$ $A_7 = \hat{A}_0 + \hat{A}_1 + \hat{A}_2 + \hat{A}_6$ The foregoing inverse relations are thus utilizable to configure the basis converter circuit of FIG. 6. When the above-specified illustrative generator polynomial is used, each of the converter circuits $66_1$–$66_{n-K-1}$ of FIG. 2 has the structure of FIG. 6. Different basis converter circuits are derivable for differing generator polynomials using the above-provided procedure.

Figure 9:
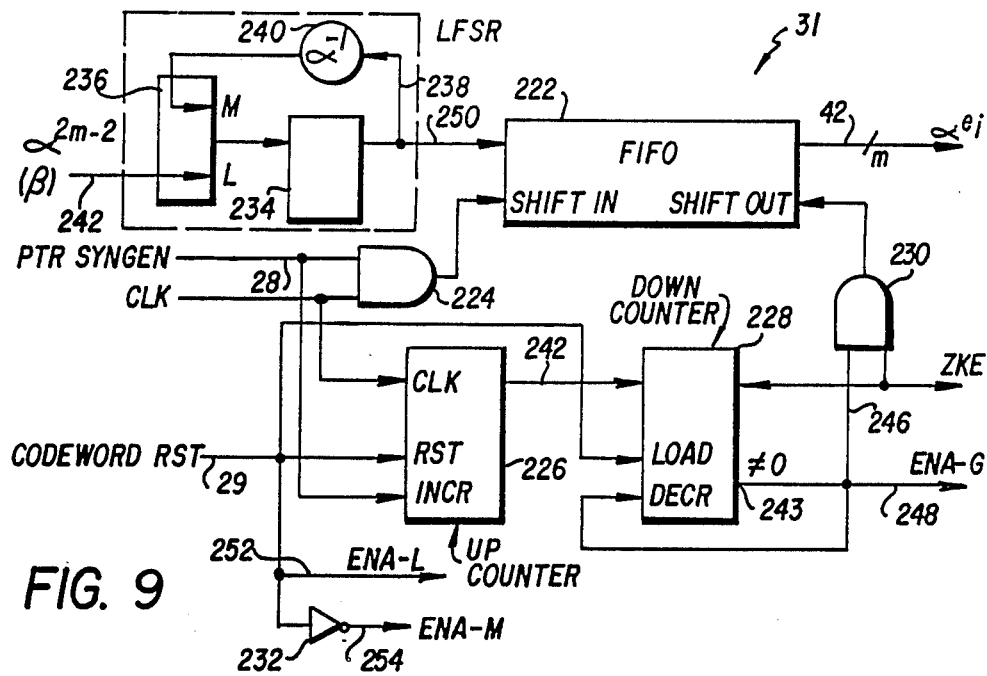
FIG. 9 is a schematic view of an erasure location value generator according to an embodiment of the invention.

The erasure location value generator 31, shown in FIG. 9, comprises a linear feedback shift register 220; a FIFO shift register 222; a first AND gate 224; an "up" counter 226; a "down" counter 228; a second AND gate 230; and, an inverter 232. The linear feedback shift register 220 includes a register 234 and an associated multiplexer 236. The data output port of the register 234 is connected by a feedback loop 238 with multiplier 240 provided thereon to the multiplexer 236. The multiplier 240 is configured to multiply the contents of the register 234 by the multiplicative inverse of the field element $\alpha$ (i.e., by $\alpha^{-1}$). The multiplexer 236, under the control of the controller/timer 39, selects whether the data input part of the register 234 is to be connected to the feedback loop 238 (signal ENA-M) or to a line 242 carrying a byte pointer signal $\alpha^{2m-2}$ in second basis (i.e. $\beta$ basis) representation (signal ENA-L).

The up counter 226 has its incrementation pin connected to the line 28 which carries the pointer signal. The reset pin of up counter 226 is connected to line 29 which carries the signal CODEWORD RST. The data output pins of the up counter 226 are connected by lead 242 to the preset data input pins of the down counter 228. The load enablement pin of down counter 228 is connected to line 29 which carries the signal CODEWORD RST. An output pin 243 of the down counter 228, which when true indicates that the contents of counter 228 is nonzero, is connected by lead 244 to the decrementation pin of down counter 228 and by lead 246 to a first input pin of AND gate 230. A second input pin of AND gate 230 is connected to a clock line carrying clock signal CKE. The output pin 243 is also connected to lead 248 which carries a signal ENA-G to a counter hereinafter described with reference to FIG. 10 and to the multiplexer 72.

The AND gate 224 has a first input pin connected to line 2S which carries the pointer signal and to a line which carries the signal SYNGEN CLK. The output pin of AND gate 224 is connected to the shift-in pin of FIFO register 222. The shift-out pin of FIFO register 222 is connected to the output pin of AND gate 230. The data input port of FIFO register 222 is connected by lead 250 to the data output pins of register 234. The data output port of FIFO register 222 is connected by the m-bit erasure value location bus 42 to the multiplexer 72 associated with the discrepancy product register 154 of the error/erasure locator circuit 32 of FIG. 2.

FIG. 9 also shows that the signal CODEWORD RST on line 29 is used to produce an ENA-L signal on line 252 and is inverted by inverter 232 to produce an ENA-M signal on line 254.

Figure 10:
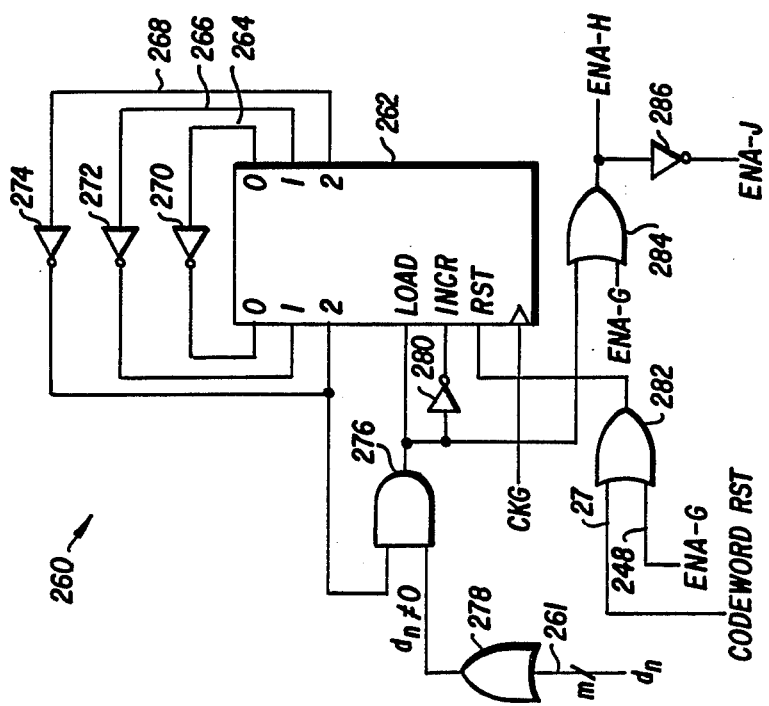
FIG. 10 a schematic view of a counter circuit according to an embodiment of the invention.

FIG. 10 shows a counter circuit 260 which receives the current discrepancy value $d_n$ on lead 261 (from the generator 58); which receives the signal CODEWORD RST on line 29; and which receives the signal ENA-G on line 248 (from the erasure location value generator 31) to produce the signals ENA-H and ENA-J. The signals ENA-H and ENA-J are used in determining whether the multiplexers in bank 74 are to apply (to their associated auxiliary registers in bank 62) either the contents of a lower order one of the auxiliary registers or the alpha basis (i.e. first basis) converted contents of an appropriate one of the coefficient registers 56.

The signal ENA-H is generated whenever a change in the length of the current error locator polynomial occurs. The signal ENA-J is generated when signal ENA-H is false. Massey (Massey, J. L., "Shift Register Synthesis And BCH Decoding," IEEE Transactions on Information Theory, IT-15, No. 1, pp. 122–123, January, 1969) describes this occurrence as a "change of L," where L is the length of the current error locator polynomial. L is updated when $d_n \neq 0$ and $2L \leq N$ where N is the iteration count. When this occurs, L is updated with $N+1-L$. This requires the use of a counter (for N), a comparator (for $2L_{23}$ $_N$), an adder (for $N+1-L$) and a register (for L).

If we let $N^+$ represent the new N; let $L^+$ represent the new L; let $N^-$ represent the old N; and let $L^-$ represent the old L, then the above rule can be stated as:

$N^+ = N^- + 1$, at each iteration $L^+ = L^-$, if $d_n 0$ or $(N^{31}+1) \leq 2N^{31}$ $L^+ = N^+ + 1 - L^{31}$, if $d_n \neq 0$ and $N^- + 1 \geq 2L$ Now, if $N^- + 1 \geq 2L$ then $N^- - 2L^- \geq -1$.

So, an equivalent condition for change of L is when the quantity $(N^- 2L^-)$ is not negative and $d_n \neq 0$. Now suppose that instead of having two counts we have only one: $N-2L$. Then when change of L is not needed, $N^+ - 2L^+ = N^- + 1 - 2L^-$ or $(N-2L)^+ = (N-2L)^- + 1$. When a change of L is needed, $N^+ - 2L^+ = N^- + 1 - 2^*(N^- + 1 - 2L^-) = -1 - (N^- - 2L^-)$ or $(N-2L)^+ = -(N-2L)^- - 1$. In 2's complement representation, the most significant bit of a negative number is '1' and for zero or positive numbers the MSB is zero. Also, the operation of taking the negative of a number and then subtracting '1' can be accomplished simply by taking the complement of the original number. For example, the 4-bit 2's complement representation for 3 is 0011. The 2's complement representation for $-4$ is 1100.

The counter 260 in FIG. 10 will increment if $d_n = = 0$ or if the present count is negative. Otherwise the counter 260 will load the complement of its present count. The counter circuit 260 of FIG. 10 includes a register 262; three feedback loops 264, 266, and 268 having inverters 270, 272, and 274, respectively, provided thereon; an AND gate 276; a first OR gate 278; a first inverter 280; second and third OR gates 282 and 284, respectively; and, a second inverter 286.

Figure 11A:
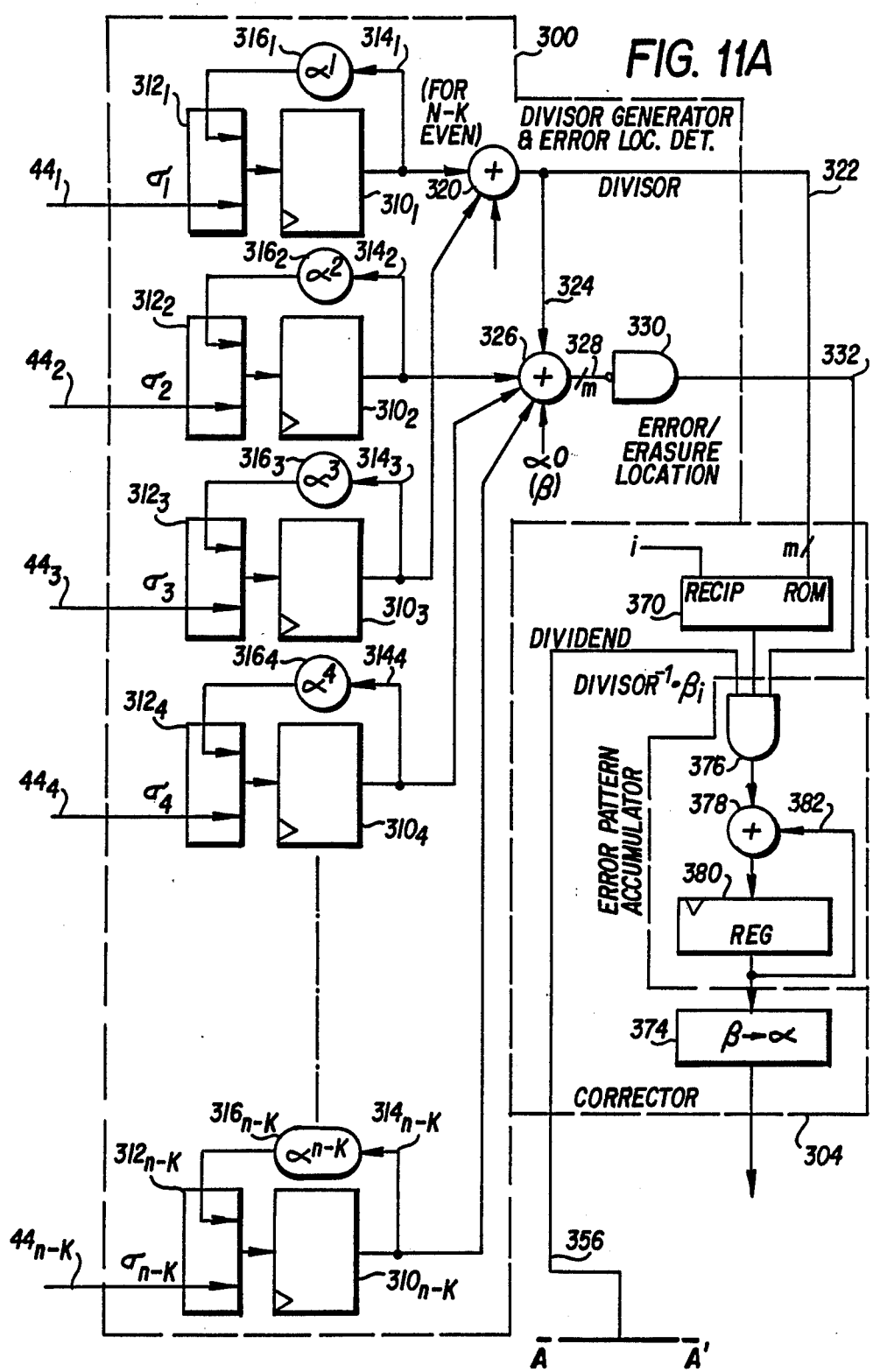
FIGS. 11A and 11B comprise a schematic view of a root search and error/erasure magnitude generator according to an embodiment of the invention; and, FIG. 12 is a flowchart which illustrates how entries are prepared for a read only memory according to an embodiment of the invention.
Figure 11B:
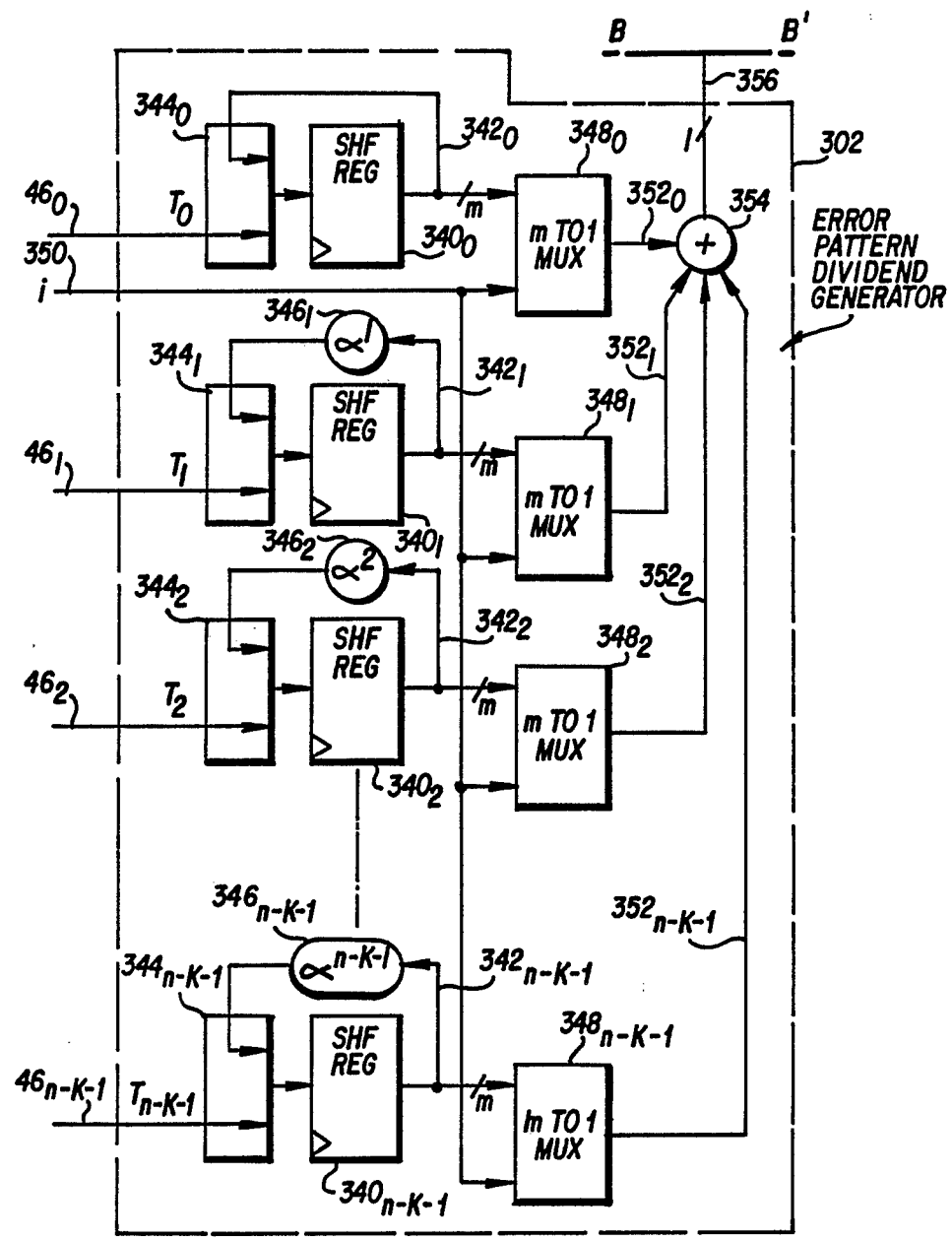

The root search and error/erasure magnitude generator 34 includes a divisor generator and error location detector (framed by broken line 300 in FIG. 11); an error pattern dividend generator (framed by broken line 302 in FIG. 11); and, a corrector circuit (framed by broken line 304 in FIG. 11).

The divisor generator and error location detector 300 shown in FIG. 11 is designed for the case wherein the quantity $(n-K)$ is even. The detector 300 includes a $n-K$ number of registers 310. Each register has a multiplexer 312 associated therewith and a feedback loop 314 for connecting the data output ports of the registers 310 with the data input port thereof via the associated multiplexers 312. Each feedback loop has a multiplier 316 thereon for multiplying the contents of its register 310 by an appropriate power of the field element $\alpha$. In this respect, multiplier $316_1$ multiplies by $\alpha^1$; multiplier $316_2$ multiplies by $\alpha^2$; and so forth.

The data input terminals of the registers 310 are connectable via their associated multiplexers 312 to appropriate leads in the coefficient bus 44 or to their respective feedback loops 314. The leads in the coefficient bus 44 are connected back to appropriate ones of the coefficient registers in bank 56 of FIG. 2. For example, leads $44_1$ connect multiplexer $312_1$ and coefficient register $56_1$; leads $44_2$ connect multiplexer $312_2$ and coefficient register $56_2$; and so forth.

The data output ports of the odd registers of the detector 300 (i.e., registers $310_1$, $310_3$, $310_5$ . . .) are applied to an adder 320. Adder 320 performs a logical XOR operation on the applied input values and produces a result, known as the divisor, on m-bit lead 322. The data output ports of the even registers of the detector 300 (i.e., registers $310_2$, $310_4$, $310_6$ . . .) are, along with the divisor on lead 324, applied to an adder 226. The adder 326 performs a logical XOR operation on the contents of the even registers 310, upon the divisor, and upon the field identity element $\alpha°$ (which is in dual or $\beta$ representation) to yield an m-bit output on leads 32B. Leads 328 are connected to the input pins of an input-inverting AND gate 330. The output of the AND gate 330 is applied as an error/erasure locator signal on line 332 to the corrector circuit 304.

The divisor generator and error location detector 300 evaluates the error/erasure locator polynomial at different roots. When the sum of the contents of all the registers 310 is zero, a root of the polynomial is located and an error location is thus found. For example, if, during a first clock cycle, a zero sum is obtained, an error is known to have occurred in a first byte or symbol of the codeword; if, during a second clock cycle a zero sum is obtained, an error is known to have occurred in a first byte of the codeword; if during a second clock cycle a zero sum is obtained, an error is known to have occurred in the second byte; and so forth. The sum of the contents of the registers 310 is obtained by adder 326.

If the sum at adder 326 is zero, then all leads 328 will carry a zero signal, and the inverting input AND gate 330 will produce a high signal, indicative of an error location, on line 332.

The error pattern dividend generator 302 includes a quantity $(n-K)$ shift registers 340. As with the detector 300, each register 340 in generator 302 has an associated feedback loop 342 and an associated multiplexer 344. The feedback loops $342_1$ through $342_{n-K-1}$ have multiplexers $346_1$ through $346_{n-K-1}$, respectively, provided thereon for multiplying the contents of the associated shift register 340 by an appropriate power of the field element $\alpha$. In this regard, multiplier $346_1$ multiplies by $\alpha^1$; multiplier $346_2$ multiplies by $\alpha^2$; and so forth. The multiplexers 344 are used to connect the data input ports of the registers 340 to either the associated feedback loop 342, or to appropriate leads in the bus 46. For example, multiplexer $344_o$ selectively connects register $340_o$ to m-bit leads $46_o$, which in turn is connected to the syndrome register $52_o$ of FIG. 2. Thus, bus 42 serves to transmit the modified syndromes, which are used for obtaining the magnitude of erasures and errors, from the syndrome registers in bank 52 to corresponding registers 340 in the generator 302.

The data output ports of the registers 340 are applied on m-bit leads to associated m-to-1 multiplexers 348. Each multiplexer 348 also receives, on a line 350, an indication i of the current clock cycle in the current clock cycle set. The multiplexers 348 use the indication i to determine which bit of their m-bit input is to be multiplexed onto serial output line 352. The serial output lines $352_o - 352_{n-K-1}$ are connected to an adder 354, which is a logical XOR gate. The one-bit output of the XOR operation performed by adder 354 is applied on line 356 to the corrector circuit 304.

The corrector circuit 304 comprises a ROM 370; a multiplier (framed by broken lines 372 in FIG. 11); and, a basis converter circuit 374. The multiplier 372 includes AND gate means 376; an adder 378; a register 380; and, a feedback loop 382 connecting the data output port of the register 380 to input pins of the adder 378.

The ROM 370 is the same type of memory device as ROM 134 and has the same look-up table stored therein. Values in the look-up table of ROM 370 are addressed using he value of the divisor (on lead 322) and of the current clock cycle or index i of the current clock set. The value obtained from ROM 370 is the product of $\beta_i$ and the multiplicative inverse of the divisor. This product from ROM 370 is ANDED, at gate means 376 with the dividend value on lead 356 and the error locator signal on line 332.

The multiplier 372 includes an AND gate means 376 which, although not shown as such, comprises m quantity of AND gates, each of the said AND gates in gate means 376 having three input pins—a first input pin connected to the error/erasure locator line 332; a second input pin connected to the serial dividend line 356; and, a third input pin connected to a unique one of the lines in the divisor lead 322.

The adder 378 comprises an XOR gate having m number of input pins connected to output pins of each of the m number of AND gates comprising the AND gate means 376. The output of gate 376 is thus non-zero only when a root of the error/erasure polynomial has been located (i.e., when an error or erasure location is detected). The output of the AND gate 376 is accumulated over sequential clock cycles in a clock cycles set by virtue of the register 380 and adder 378 to produce an accumulated error pattern which is in the second or $\beta$ basis representation. The accumulated error pattern in the second basis is then applied to a basis converter circuit 374 so that the accumulated error pattern is converted to a first or $\alpha$ basis representation. The basis convert circuit 374 is, for a given generator polynomial, essentially identical to the structure of the basis converter circuits 66 described hereinbefore.

Figure 12:
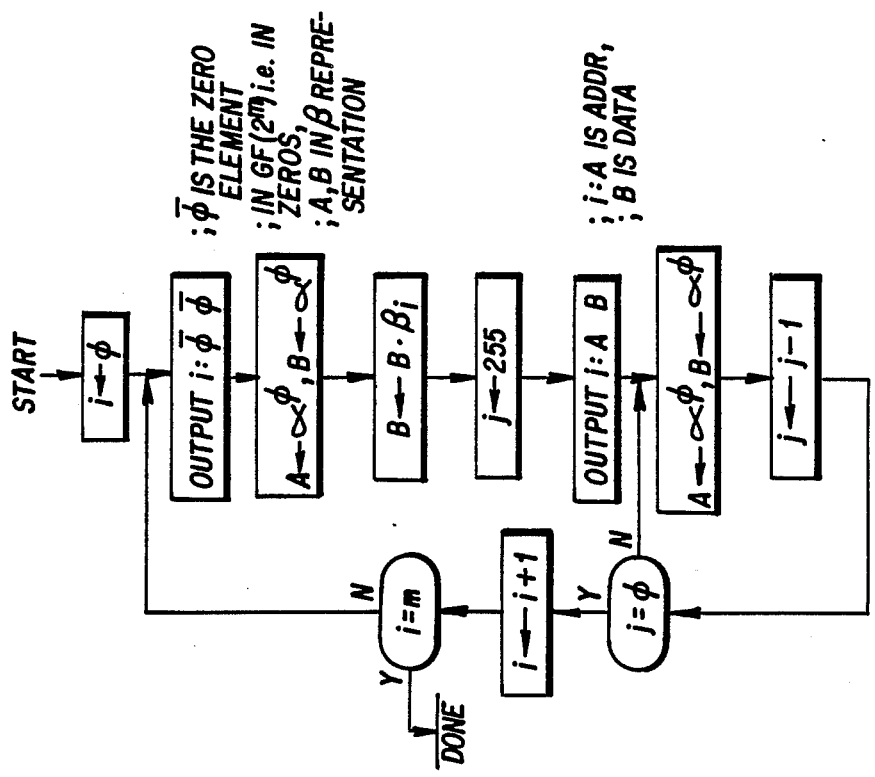

FIG. 12 is a flowchart which illustrates how entries generated for the look-up table stored in ROMs 134 and 370. Each address in ROM 134 and ROM 370 is the concatenation of a bit index ("i") and an element ("A") of GF ($2^m$The bit index i ranges from zero to m-1 (binary representation) and A ranges from $\alpha^o$ to $\alpha^2{}_m - 2$ (in $\beta$ basis representation). For an address of i:A the output is $A^{-1}\beta_i$. The flowchart of FIG. 12 is used to generate ($2^m \cdot \log_2 m$) entries for the ROMs 134 and 370.

In connection with generating entries for the table of ROM 134, consider an example for m = 8 and G(X) = $X^8 + X^4 + X^3 + X^2 + 1$. As described herein, multiplication by is accomplished by shifting one place from high order bit to low order bit and shifting into the high order position the exclusive OR of bits 0, 2, 3 and 4. It can be shown that multiplication by $\alpha^{-1}$ is accomplished by shifting from low order to high order and shifting into the low order position the exclusive OR of bits 1, 2, 3 and 7. Multiplication by $\oplus_i$ is done in the following way: , $\oplus_i$, in $\beta$ representation, is the vector with "1" in the ith position and "0" elsewhere. A PISO multiplier can be used to produce $\beta_i$ $\beta$ *by initializing the register with* $\beta_i$ and clocking 8 times to serially produce the product. $\alpha$ must be in $\alpha$ representation.

OPERATION

The decoder 26 of FIG. 1 processes codewords in pipeline fashion during successive codeword cycles. That is, during a first codeword cycle the syndrome generator 30 and erasure generator 31 operate on a first codeword; during a second codeword cycle the error/erasure locator 32 operate on the first codeword while the syndrome generator 30 and the erasure generator 31 operate on a second codeword; during a third codeword cycle the generator 34 operates on the first codeword while the locator 32 operates on the second codeword and while the generator 30 and 31 operate on a third codeword. Thus, three different codewords are simultaneously operated on by the decoder 26.

At the beginning of a codeword cycle the channel signal processor 24 applies a CODEWORD RST signal on line 29. The signal CODEWORD RST is used to reset the registers 45 of the syndrome generator 30 and the up counter 226 of the erasure location value generator 31. The signal CODEWORD RST is also used to load the down counter 228 with the value stored in the up counter 226 at the end of the previous codeword cycle. The channel signal processor then applies the received codeword data symbol to the registers 45 of the syndrome generator so that the syndromes $S_o, S_1, \ldots S_{n-K-1}$ can be generated. The syndromes are generated in a manner well known in the prior art.

The channel signal processor 24, being of a type capable of detecting erasures, also generates, during a codeword cycle, signals associated with erasure pointers. The channel signal processor 24 loads the linear feedback shift register 234, upon receipt by multiplexer 236 of signal ENA-L, with an initialization value (in $\beta$ basis representation) for tracking bytes in a codeword. The tracking initialization value, denoted as $\alpha^{2m-2}$, is applied on line 242. As each data symbol is thereafter received, an ENA-M signal is generated and used by multiplexer 236 to connect the data input port of the linear feedback shift register 234 to its feedback loop 23S. As a result, upon receipt of successive data symbols, the sequence of location tracker values $\alpha^{2m-2}$, $\alpha^{2m-3}$, ... $\alpha^1$, $\alpha^0$ is generated. If the channel signal processor 24 places a true signal on line 28 for any data symbol in a codeword, the then-occurring value in the register 234 is shifted into the FIFO register 222 and the up counter 226 is incremented. Concurrently with the shifting of erasure location values for a current codeword into the FIFO register 222, erasure location values for a previous codeword are shifted out of the FIFO register 222 and onto bus 42 for application to the error/erasure locator 32.

At the error/erasure locator 32 each codeword cycle comprises (n-K) "coefficient" iterations followed by (n-K) "modified syndrome" iterations. Each coefficient iteration requires two sets of m clock cycles or clock pulses; each modified syndrome iteration requires one set of m clock cycles or clock pulses. Completion of all coefficient iterations yields the coefficients of the error/erasure polynomial. Thereafter, completion of the modified syndrome iterations yields modified syndromes usable by the circuit of FIG. 11 for obtaining the magnitude of errors and erasures.

At the beginning of a codeword cycle the signal ENA-K is generated and used by the multiplexers 67 of the error/erasure locator 32 to load syndrome values from the syndrome generator 30 into the error/erasure locator 32. The syndrome values $S_0, S_1, \ldots S_{n-K-1}$ are transmitted from the syndrome generator 30 to the error/erasure locator 32 in a parallel manner on bus 40. That is, syndrome $S_0$ is transmitted on m-bit lead $40_o$ in bus 47 to syndrome register $52_o$ (via multiplexer $69_o$) simultaneously with the transmission of syndrome $S_1$ on lead $40_1$, to syndrome register $52_{n-K-1}$(via multiplexer $69_{n-K-1}$), which is simultaneous with the transmission of syndrome $S_{n-K-1}$ on lead $40_{n-K-1}$ to register $52_1$, 1, and so forth. The simultaneous, parallel transmission of syndrome values to the error/erasure locator 32 thus eliminates prior art shift register interface structure between a syndrome generator circuit and an error locator circuit.

If, during a previous codeword cycle, the erasure location value generator 31 of FIG. 9 detected one or more erasures with respect to the codeword currently being operated upon by the error/erasure locator 32, the error/erasure locator 32 is required to take the erasure location values $\alpha^i$ into consideration in determining the coefficients of the error/erasure polynomial. If, for example, a number q of erasure location values are detected for a codeword, the first q number of coefficient iterations utilize the erasure location values—the first erasure location value is utilized during the first coefficient iteration; the second erasure location value is utilized during the second coefficient iteration; and so forth.

Assuming that q=2 erasures exist for the codeword being operated upon by the error/erasure locator circuit 32, the circuit 32 essentially performs two basic operations during the first q coefficient iterations of a codeword cycle. By the first operation, which occurs in the first set of m clock cycles, the PISO multipliers in bank 54 obtain an inner product to produce a bit of the current discrepancy $d_n$ and the SIPO multiplier 60 yields the discrepancy product $d_n d_m - 1$. By the second operation, which occurs in the second set of m clock cycles, the PISO multipliers in bank 61 multiply an appropriate erasure location value $\alpha^{ei}$ (loaded into register 154) by the contents of the auxiliary registers in bank 62.

For the remaining (n−K)-q coefficient iterations, the first operation for finding the current discrepancy also occurs during the first set of clock cycles but, in addition, the discrepancy product $d_n d_m{}^{-1}$ is also stored in the discrepancy product register 154. During the second set of clock cycles for the remaining (n−K)-q coefficient iterations, the PISO multipliers in bank 61 multiply the discrepancy product $d_n d_m{}^{-1}$ in the register 154 by the contents of the auxiliary registers in bank 62.

During the first coefficient iteration following the transmission of a codeword's syndrome to the error/erasure locator 32, the locator 32 operates primarily upon the syndrome value $S_o$ in the register $52_o$. During the second coefficient iteration, the syndrome value $S_o$ is shifted on lead $92_o$ to syndrome register $52_1$, and the syndrome value $S_1$ is shifted on lead 93 into syndrome register $52_o$, so that the locator 32 primarily operates upon the syndrome values $S_1$ and $S_o$ during the second iteration. With each coefficient iteration the contents of the registers in bank 52 are thus shifted rightwardly (clockwise) along the syndrome shift path 92. The iteration number for the codeword is the number of syndrome values currently being operated upon, with the order of the active syndrome values increasing with successive iterations. Thus, during the fourth coefficient iteration for a codeword, four syndrome values ($S_0$, $S_1$, $S_2$, and $S_3$) are operated upon.

At the beginning of a first clock cycle (t=1) of a first coefficient iteration each of the syndrome registers in bank 52 is loaded in the afore-described manner. Moreover, each of the coefficient registers in bank 56 and each of the auxiliary registers in bank 62 are initialized. With regard to the initialization of the coefficient registers, during time t=1 of the first coefficient iteration the multiplexer 104 loads the multiplicative identity field element $\alpha^0$ (in second basis) into coefficient register $56_o$ and null values into the remaining coefficient registers. Register 132 is also initialized at the value $\alpha_0$ in second basis representation. Auxiliary register $62_o$ is initialized with the value $\alpha^o$ (in first basis); the remaining auxiliary registers are initialized at a null value.

Each AND gate means 110 included in the PISO multiplier bank 54 performs a logical AND operation on the m-bit contents of the syndrome register and the m-bit contents of the coefficient register to which its input terminals are connected. Thus, at t=1 of the first coefficient iteration, AND gate means $110_o$ logically ANDs the contents $S_o$ of syndrome register $52_o$ and the contents ($\alpha^o$) of the coefficient register $56_o$. Due to the null values stored in the remaining coefficient registers, at t=1 none of the other AND gate means has a non-null output. The adder 112 performs an exclusive OR (XOR) operation on the outputs from the plurality of AND gate means 110. The result of the XOR operation of adder 112 is the inner product of the paired registers, or the first bit of the current discrepancy $d_{ni}$, which, for t=1, is $d_{n1}$. The current discrepancy dn is serially-formatted and, as seen hereinafter, is in second basis formatted and, as seen hereinafter, is in second representation.

At time t=1 of the first iteration, the first bit of the discrepancy $d_{n1}$ is applied both to the prior discrepancy generator 5B and to the SIPO multiplier 60. The serially-formatted current discrepancy $d_{n1}$ is loaded into the shift register 130, whereat a parallel-formatted m-bit value therefor appears at the register 130's output terminals for transmission to the prior discrepancy determination register 132. When the counter circuit of FIG. 10 generates the signal ENA-H, pin CKD of register 132 is pulsed to cause $d_n$ to be latched into register 132. Register 132 determines a prior discrepancy $d_m$ in a conventional manner well known to those skilled in the art.

The m-bit value $d_m$ is applied to the ROM 134, which utilizes an internally-stored look-up table to determine the multiplicative inverse product $d_m{}^{-1}\beta_i$; the prior discrepancy. The appropriate value extracted from ROM 34 depends on both the value of the prior discrepancy $d_m$ determined by register 132, and the number i of the particular clock cycle of the current set. In the latter regard, on line 140 a value i=t−1 is applied to the ROM 134. The SIPO multiplier 60 multiplies the serial current discrepancy $d_{ni}$ by the m-bit multiplicative inverse quantity $d_m{}^{-1}\beta_i$.

At time t=2 of the first coefficient iteration the value $\alpha$ is loaded into the first coefficient register $56_o$. In this regard, during t=1 the multiplier $102_o$ on feedback loop $100_o$ multiplied the contents of coefficient register $56_o$ (which, at time t=1, was $\alpha^o$) by the field element t=2, to obtain the product $\alpha$. At time t=2, the multiplexer $70_o$ applied the product $\alpha$ of multiplier $102_o$ to the coefficient register $56_o$. During clock cycle t=2 of the first coefficient iteration, essentially the same steps occur with respect to the bank 54 of PISO multipliers and the prior discrepancy generator 58 as those described above with respect to t=1, one difference being that the contents of the coefficient register $56_o$ has been multiplied by the field element $\alpha$, which, accordingly, affects the output value $d_{ni}$.

At time t=3 of the first iteration, the value $\alpha^2$ is loaded into the coefficient register $56_o$ by virtue of the feedback loop $100_o$ and the multiplexer $70_o$. Thus, it is seen that for successive clock cycles, the contents of the coefficient register $56_o$ becomes higher powers of the field element $\alpha$. In this regard, for t=4, t=5, t=6, t=7, and t=8, respectively, of the first iteration, the contents of the register $56_o$ will be $\alpha^3$, $\alpha^4$, $\alpha^5$, $\alpha^6$, and $\alpha^7$. Accordingly, during those successive clock cycles the multiplied contents of coefficient register $56_o$ will be utilized for producing new values for $d_n$.

On the mth clock cycle of a coefficient iteration, signal ENA-B is activated so that the contents of the registers comprising bank 52 are shifted clockwise to the next right-most register. That is, the contents of register $52_o$ is shifted into register $52_1$, the contents of register $52_{n-K-1}$ is shifted into register $52_o$, and so forth. Also on the mth clock cycle, register bank 56 is loaded via multiplexer 70 from register bank 64.

Assuming m 32 8, at time t=9 of a coefficient iteration, the data input port of the product discrepancy register 154 is connected either to the adder 152 or to the erasure value locator bus 42. When the register 154 is connected to the adder 152, the discrepancy product $d_n d_m^{-1}$ in second basis representation is stored in the register 154. When the register 154 is connected to the bus 42, the erasure locator values $\alpha^{ei}$ are stored in the register 154.

If, during a previous codeword cycle, the erasure location value generator 31 determines that of number of erasures were detected for the codeword currently being processed by the error/erasure locator 32, the register 154 has erasure locator values stored therein the ninth clock cycle. In the example under discussion wherein q=2, at the ninth clock cycle of the first coefficient iteration for a codeword, the first erasure locator value $\alpha^{ei}$ is loaded into the register 154. At the ninth clock cycle of the second coefficient iteration for the codeword, the second erasure locator value $\alpha^{e2}$ is loaded into the register. For the ninth clock cycle of the remaining (n−K)-q coefficient iterations, the register 154 has the discrepancy product $d_n d_m^{-1}$ loaded therein.

Before discussing the multiplication of the contents of register 154 using the PISO multipiers in bank 61 as occurs during the second set of clock cycles (i.e., clock cycles m+1 through 2m) of a coefficient iteration, a brief digression regarding FIG. 9 is in order to explain the loading of erasure locator values into the register 154 generally. Upon the generation of signal CKE, the FIFO register 222 clocks out an erasure locator value $\alpha^{ei}$. The number q of erasure locator values clocked out of FIFO register 222 for a codeword is controlled by down counter 228 Down counter 228 enables FIFO register 222 to clock out an erasure locator value as long as decrementation of the down counter 228 not reach zero. Since the down counter 228 is preloaded with the q count from up counter 226, only q number of decrements can occur for a codeword. Moreover, as long as the contents of counter 228 is non-zero, line 24S is true and the signal ENA-G is generated. While ENA-G is true, multiplexer 72 is directed to connect the data input port of register 154 to the erasure value locator bus 42 for the receipt by locator 32 of the erasure locator values being $\alpha$ clocked out of the FIFO register 222.

Thus, in the specific example of two erasures for a codeword, at time t=9 of the first coefficient iteration the first erasure value $\alpha^{ei}$, rather than the product $d_n d_m^{-1}$, is loaded into the discrepancy product register 154 by virtue of signals ENA-G and CKE. Recall that upon initialization for the codeword, the multiplexers in bank 74 were operated to load a field identity element $\alpha^o$ into auxiliary register $62_o$ and to initialize auxiliary registers $62_1 - 62_{n-K-1}$. At time t=9 the m-bit contents of each of the auxiliary registers 62 is multiplied by the m-bit contents of register 154 using the PISO multipliers in bank 61. However, at time t=9 of the first coefficient iteration, only PISO multiplier 61 will operate on a nonzero auxiliary register $62_o$.

The result of the multiplication by PISO multiplier $61_1$, at time t=9 of the first coefficient iteration, is a serial output which is applied on line $186_1$ to the shift register $64_1$. A parallel formatted, m-bit representation of the contents of shift register $64_1$ appears at the data output port of register $64_1$ 1 and is applied to m-bit lead $190_1$ connected to multiplexer $70_1$.

During clock cycle t=10 of the second iteration, the contents of register 154 is multiplied by the field element $\alpha$ by virtue of the operation of multiplier 166 and the product restored therein. The contents of the register 154 is multiplied by the contents of each of the auxiliary registers using the PISO multipliers in bank 61 as in like manner as occurred during clock cycle t=9. Again, only auxiliary register $62_o$ will not have null contents. The result of the multiplication is added to the current contents of shift register $64_1$ by the adders $172_1$ with a revised m-bit signal appearing on lead $190_1$. Thus, the shift registers 64 and adders 172 serve essentially to accumulate successive products generated by an associated one of the PISO multipliers in bank 61. Similar operations occur for each remaining clock cycles (t=11, 12, . . . 16) in the second set of clock cycles for the first coefficient iteration.

On the last clock cycle of the first coefficient iteration (i.e., clock cycle 2m=16) several further actions occur. First, the register 154 is cleared using a signal RST—DNDM—ACC—generated by the timer/controller 39. Second, signals ENA-D and CKB are generated to load the m-bit signals on leads 190 into the respective coefficient registers $56_1 - 56_{n-K-1}$. Third, the signal CKG is generated causing the bank 62 of auxiliary registers to either be loaded with values from corresponding ones of the coefficient registers in bank 56 via basis converters 66 (if the signal ENA-H is activated) or be shifted to the right into a higher order auxiliary register (if the signal ENA-J is activated).

Similar actions occur on the last clock cycle of each coefficient iteration. As described hereinbefore, the counter circuit of FIG. IO is utilized in the determination of whether signal ENA-H or ENA-J is to be generated. If signal ENA-H is generated, pin CKD of the register 132 is also pulsed, causing $d_n$ n to be latched into prior discrepancy register 137.

At clock cycle t=1 of a second coefficient iteration, the following actions have been taken: (1) the syndrome $S_o$, formerly in register $52_o$, has been shifted into register $52_1$; (2) the next highest order syndrome value, i.e., syndrome $S_1$, has been shifted into syndrome register $52_0$ in accordance with the above-described syndrome clockwise circular shift; (3) the coefficient register $56_0$ has again been initialized with the contents $\alpha^0$; and, (4) the multiplexers 70 have loaded the m-bit signals on leads 190 into the respective coefficient registers $56_1$–$56_{n-K-1}$. During clock cycle t=1, new values of $d_n$ and $d_m^{-1}\beta$ are obtained by the convolution circuit 53 and the prior discrepancy generator 58. At time t=1 of the second coefficient iteration a non-null value may appear in coefficient register $56_1$. The values $d_n$ and $d_m^{-1}\beta$ are determined as in the manner described for the first iteration, it being understood, however, that during the second coefficient iteration only the values in coefficient registers $56_0$ and $56_1$ may not be null.

In the above regard, during the first set of clock cycles for the second coefficient iteration the multiplier $102_1$ multiplies the contents of the coefficient registers by the field element $\alpha$. Thus, if at t=1 of the second coefficient iteration, the value W were loaded into register $56_1$, at time t=2 of the second iteration register 561 would contain W$\alpha$; at time t=3, W$\alpha^2$; and so forth up until t=m=8. Thus, by multiplying the contents of the registers 56 by increasing powers of the field element $\alpha$, the multipliers 102 on feedback loops 100 serve to facilitate a multiplication of the contents of their associated coefficient registers 56 in a second or dual basis.

At time t=9 of the second coefficient iteration, the PISO multipliers in bank 61 multiply the contents of register 154 (the second erasure value) by the contents of the auxiliary registers 62. Thus, the PISO multipliers 61 multiply a first basis represented value (in the auxiliary registers 62) by a second or dual basis represented value.

During each of the second set of clock cycles (t=m+1 to t=2m) occurring in the second coefficient iteration, the shift registers 64 and adders 172 serve to accumulate the serial products generated by successive multiplication operations of their associated PISO multiplier 61. As explained with reference to the first iteration, the shift registers 64 produce m-bit output signals on their respective leads 190. The m-bit signals on leads 190 are applied, at the end of each iteration, to an associated one of the coefficient registers 56.

During successive coefficient iterations 3, 4, ... n-K, the syndrome values in registers 52 are circularly shifted (rightwardly as shown in FIG. 2) so that a higher order syndrome value is loaded into syndrome register $56_0$. Moreover, during each new iteration, a higher order coefficient register 56 has loaded therein an m-bit value corresponding to a serial value in its associated shift register 64. Since the number of erasures for the example under discussion is two (i.e. q=2), erasure values are not applied to register 154 during the third and successive coefficient iterations. Rather than utilize erasure values during the third and successive coefficient iterations, at the m+1th clock cycle of each coefficient iteration the product $d_n d_m$ of adder 152 is loaded into register 154 by the generation of signal ENA-F.

During the second set of clock signals for each coefficient iterations 3, 4, ... n−K, the contents of the register 154 are operated upon in the same manner as earlier described with reference to the first two coefficient iterations of the codeword cycle (e.g., multiplying using the PISO multipliers in bank 61 and accumulating into registers in bank 64). In this manner accumulated values are loaded into the coefficient registers in bank 56. Thus, at the end of n−K iterations, the contents of the coefficient registers $56_0 56_{n-K}$ will be the second basis representations of the coefficients of the error locator polynomial for the received codeword.

Upon the completion of (n−K) number of coefficient iterations, the error/erasure locator 32 is capable of generating modified syndromes during (n−K) number of modified syndrome iterations and storing the modified syndromes in the bank 52 of syndrome registers for transmission (on bus 46) to the root search and error/erasure magnitude calculator 34. The modified syndromes, explained by Gallager, R. G. [*Information Theory and Reliable Communication;* Wiley, New York, 1987] are expressed as follows:

$$T_i = \sum_{j=0}^{i} \sigma_j S_{i-j}$$

where $\sigma_i$, are error/erasure coefficients and where $S_{e-j}$ are syndrome values.

At the end of (n−K) number of coefficient iterations for a codeword, the lowest order syndrome value $S_o$ is in the highest order syndrome register $52_{n-K-1}$, syndrome value $S_1$ is in syndrome register $52_{n-K-2}$, and so forth. The error/erasure coefficients $\sigma_0, \sigma_1, \sigma_2 \ldots \sigma_{n-K}$ registers $56_0, 56_1, 56_2, \ldots 56_{n-K}$, respectively.

Each modified syndrome iteration includes m clock cycles. During the m clocks of each modified syndrome iteration, signal ENA-C is activated. As in the coefficient iterations, during the m clock cycles of each modified syndrome iteration the PISO multipliers in bank 54 are used to develop an inner product of paired syndrome registers in bank 52 and coefficient registers in bank 56. Upon the completion of the m clock cycles for a modified syndrome iteration, m serial bits produced by adder 112 are stored in the shift register 130. The contents of shift register 130 is a modified syndrome $T_i$.

On the mth clock cycle of a modified syndrome iteration, signal ENA-A is activated and pins CKA of the syndrome registers in bank 52 are pulsed, with the result that the contents of the syndrome registers in bank 52 are shifted leftwardly or counter clockwise as shown in FIG. 2, and the contents of the shift register 130, i.e., a modified syndrome, is shifted into the syndrome register $52_{n-K-1}$. At the mth clock cycle of a modified syndrome iteration the coefficient registers are reloaded with the coefficient values produced during the n−K number of coefficient iterations upon activation of signal ENA-D During successive modified syndrome iterations fewer and fewer of the PISO multipliers in bank 54 are activated. For example, during the first modified syndrome iteration for a codeword all PISO multipliers $54_o$ through $54_{n-K-1}$ are activated; during the second modified syndrome iteration only PISO multipliers $54_o$ through $54_{n-K-2}$ are activated (since syndrome register $52_{n-K-1}$ contains the modified syndrome $T_{n-K-1}$); during the third modified syndrome iteration only PISO multipliers $54_o$ through $54_{n-K-3}$ are activated (since syndrome registers $54_{n-K-1}$ and $54_{n-K-2}$ contain the modified syndromes $T_{n-K-2}$ and $T_{n-K-1}$, respectively), and so forth. Thus, at the end of (n−K) number of modified syndrome iterations, the syndrome registers $52_o$ through $52_{n-K-1}$ have stored therein the modified syndromes $T_{N-K-1}$ through $T_0$, respectively.

During the m clock cycles of each modified syndrome iteration the PISO multiplexers in bank 54 operate in essentially the same manner as in the coefficient iterations, including the successive multiplication of the contents of the coefficient registers in bank 56 by the field element $\alpha$. As mentioned above, however, at the beginning of each modified coefficient iteration all coefficient registers in bank 56 have reloaded therein the coefficient values obtained after the execution of $(n-K)$ number of coefficient iterations. The data for reloading is obtained from the associated shift registers in bank 64.

Upon completion of the (n-K) number of modified syndromes for a codeword cycle, the error/erasure coefficients $\sigma T_1$, $\sigma_2$, $\sigma T_{n-K}$ are stored in coefficient registers $56_1$ through $56_{n-K}$ and the modified syndromes $T_n-K-1$ $T_n-K-2$. $T_o$ are stored in the syndrome registers $52_o$, $52_1$, $52_{n-K-1}$. The error/erasure coefficients are transmitted to the root search and error/erasure magnitude generator 34 on bus 44 (having $((n-K) \times m)$ number of leads) while the modified syndromes are transmitted to the generator 34 on bus 46 (also having $((n-K) \times m)$ number of leads).

As understood from the foregoing structural description of the divisor generator and error location detector 300, the circuit 300 uses the error/erasure coefficients $\sigma_1$, $\sigma_2$, ... $\sigma_{n-K}$ both to locate bytes in a codeword at which errors or erasures occur, and to generate a divisor. If the circuit 300 locates an error or erasure for a byte of a codeword, a true signal is applied on line 332 to the corrector circuit 304 while the divisor generated by circuit 300 is applied on m-bit lead 322 to the corrector circuit 304.

As understood from the foregoing structural description of the error pattern dividend generator 302, the generator circuit 302 uses the modified syndromes $T_o$, $T_1$, ... $T_{n-K-1}$ to produce a serial stream of bits of a dividend. The dividend serial bit stream is applied to the corrector circuit 304 by lead 356.

The correction circuit 304 of FIG. 11 serves to multiply, for bytes at which an error or erasure is located, the error pattern dividend bit stream on line 356 by a divisor-related quantity; to accumulate the product of successive such multiplications; and, to convert the accumulated product from the second basis representation (i.e., $\beta$ basis representation) to the first basis representation (i.e., $\alpha$ basis representation).

The divisor-related quantity utilized in the multiplication operation performed by corrector circuit 304, obtained from the ROM 370, is the product of the multiplicative inverse of the divisor (generated by circuit 300 and applied on line 322) and the value $\beta i$. The ROM 370 has stored therein essentially the same lookup table as does ROM 134, with values in the table of ROM 370 being addressable using both the divisor value and the current clock cycle number (i.e., "i").

During m clock cycles the multiplier 372 multiplies the dividend serial bit stream on line 356 by the m-bit value extracted from ROM 370 (i.e., the product of, $\beta$ and the multiplicative inverse of the divisor). Over the m clock cycles the successive products from multiplier 372 are accumulated in the register 380. The product in register $\beta$ is converted by converter circuit 374 from second or $\beta$ basis representation to first or $\beta$ basis representation.

As understood from the foregoing, the root search and error/erasure magnitude generator of FIG. 11 calculates the error magnitudes Ej in accordance with the following:

$$E_j = \frac{\sum\limits_{i=0}^{n-k-1} \alpha^{i(2m-1-\mu j)} T_i}{\sum\limits_{i=1}^{(n-k-1)/2} \alpha^{(2i-1)(2m-1-\mu j)} \sigma_{2i-1}}, N\text{-}K \text{ EVEN}$$

$$E_j = \frac{\sum\limits_{i=0}^{n-k-1} \alpha^{i(2m-1-\mu j)} T_i}{\sum\limits_{i=0}^{(n-k-1)/2} \alpha^{2i(2m-1-\mu j)} \sigma_{2i}}, n\text{-}k \text{ odd}$$

where $U_j$ is an error/erasure location (integer from 0 to $2m-2$ where $2m-2$ represents an error in the first codeword symbol and 0 represents an error in the last codeword symbol) and $T_i$ is defined as prescribed above.

While the invention has been particularly shown and described with reference to the preferred embodiments thereof, it will be understood by those skilled in the art that various alterations in form and detail may be made therein without departing from the spirit and scope of the invention. For example, it is understood that, should a generator polynomial other than the one illustrated herein be employed, that the structure of elements such as the multipliers 102 and 106 and the basis converter circuits 66 and 374 are reconfigurable in accordance with the principles set forth herein to take into consideration the usage of a different generator polynomial.

The embodiments of the invention in which an exclusive property or privilege is claimed are defined as follows:

1. An error correction method of decoding a received codeword to obtain coefficients of a locator polynomial, said method comprising the steps of:
   (1) initializing a plurality of coefficient registers and loading a multiplicative identity field element expressed in a second basis representation into a first one of said coefficient registers;
   (2) loading syndrome values expressed in a first basis representation into appropriate ones of a plurality of syndrome registers;
   (3) using the contents of said coefficient registers and the contents of said syndrome registers to obtain a current discrepancy dn expressed in said second basis representation;
   (4) obtaining a quantity related to a multiplicative inverse $d_m{}^{-1}$ of a prior discrepancy $d_m$, said quantity related to said multiplicative inverse $d_m{}^{-1}$ being expressed in said second basis representation;
   (5) multiplying said current discrepancy $d_n$ by said quantity related to said multiplicative inverse $d_m{}^{-1}$ to obtain a discrepancy product $d_n d_{m-1}$;
   (6) converting the contents of a plurality of said coefficient registers from said second basis representation to said first basis representation;
   (7) multiplying the converted contents of certain ones of said plurality of coefficient registers by the discrepancy product $d_n d_m{}^{-1}$ to obtain a plurality of successions of products;
   (8) accumulating related ones of said products successively obtained in step (7) and loading said accumulations into appropriate ones of said coefficient registers.

2. The method of claim 1, wherein said step (3) of using the contents of said coefficient registers includes multiplying the contents of said coefficient registers by a field element and loading the product of said multiplication for each coefficient register back into those respective coefficient registers.

3. The method of claim 1, wherein said step (3) of using the contents of said coefficient registers and the contents of said syndrome registers to obtain a current discrepancy $d_n$ further comprises the steps of:
 determining an inner product using the contents of a plurality of pairs of coefficient registers and syndrome registers.

4. The method of claim 3, wherein said inner product is a serial output.

5. The method of claim 1, wherein said syndrome values are simultaneously loaded into appropriate ones of said plurality of syndrome registers.

6. The method of claim 1, wherein said current discrepancy $d_n$ is obtained as having a serial format, wherein said step (4) of obtaining said quantity related to said multiplicative inverse $d_m^{-1}$ comprises the steps of:
 converting said current discrepancy $d_n$ from a serial format to a parallel format;
 using said current discrepancy $d_n$ in a parallel format to determine a prior discrepancy $d_m$ in parallel format; and,
 determining the quantity related to the multiplicative inverse $d_m^{-1}$ of said prior discrepancy and expressing said quantity the in said second basis representation.

7. The method of claim 6, wherein the step of expressing the multiplicative inverse $d_m^{-1}$ of said prior discrepancy in said second basis representation involves selecting an appropriate value stored in a memory.

8. The method of claim 1, wherein said step (5) of multiplying said current discrepancy by said quantity related to said multiplicative inverse involves multiplying a serially formatted quantity by a parallel-formatted quantity.

9. The method of claim 8, wherein said serially formatted quantity is applied to first input terminals of a plurality of logical gates, wherein second input terminals of said logical gates are connected to a unique lead included in a bus comprising a plurality of parallel leads for transmitting said parallel-formatted quantity and wherein said gates perform a logical AND operation upon their respective inputs.

10. The method of claim 9, wherein the results of said logical AND operations are applied to a gate whereat an exclusive OR operation is performed.

11. The method of claim 1, wherein said step (6) of converting the contents of a plurality of said coefficient registers from said second basis representation to said first basis representation involves inputting the contents of a coefficient circuit into a converter circuit, the structure of said converter circuit being determined by a particular generator polynomial.

12. The method of claim 1, wherein said step (7) of multiplying the converted contents of certain ones of said plurality of coefficient registers by the discrepancy product $d_n d_m^{-1}$ includes:
 multiplying the product $d_n d_m^{-1}$ by a power i of a field member to obtain a product $d_n d_m^{-1} \alpha^i$;
 applying the product $d_n d_m^{-1} \alpha^i$ to first input terminals of a plurality of logical AND gates associated with respective certain ones of said coefficient registers; and,
 applying the converted contents of each of a plurality of coefficient registers to second input terminals of respective ones of said plurality of logical AND gates.

13. The method of claim 12, wherein said codeword has n number of m bit symbols including K informational symbols, wherein said error locator polynomial has coefficients $\sigma_o, \sigma_1, \ldots \pi_{n-K}$, and wherein the converted contents of the coefficient register for coefficient $\sigma_c$ is applied to the second input terminal of a logical AND gate associated with the coefficient register for coefficient $\sigma_{c+1}$, for $c=1$ to $n-K-1$.

14. The method of claim 13, wherein a plurality of syndrome values are simultaneously loaded into appropriate ones of said syndrome registers.

15. An error correction method of decoding a received codeword, said codeword having n number m-bit symbols including K informational symbols, to obtain coefficients $\sigma_o, \sigma_1, \ldots \sigma_{n-K}$ of a locator polynomial, said method comprising the steps of:
 (1) initializing a bank of n-K coefficient registers and loading a multiplicative identity field element expressed in a second basis representation into a first one of said coefficient registers;
 (2) loading a syndrome value of a first order $S_o$ and having a first basis representation into a first one of a bank of n-K syndrome registers;
 (3) multiplying, for each of a first set of clock cycles, the contents of each of said coefficient registers by a field element $\alpha$ and loading the result of said multiplication back into said coefficient registers for possible further multiplication by said field element $\alpha$ during a succeeding clock cycle;
 (4) determining the inner product of the contents of each of said coefficient registers and an associated one of said syndrome registers during each of a first set of clock cycles to obtain a serial output in said second basis representation indicative of a current discrepancy $d_n$;
 (5) obtaining, during said first set of clock cycles, an m-bit value in second basis representation of a quantity related to a multiplicative inverse $d_m^{-1}$ of a prior discrepancy dm;
 (6) during said first set of clock cycles, said serial output indicative of said current discrepancy dn by said quantity related to said multiplicative inverse $d_m^{-1}$ to obtain an m-bit second basis representation of a discrepancy product $d_n d_m^{-1}$ and loading said product in a discrepancy product register;
 (7) multiplying, for clock cycles included in a second set of clock cycles, the contents of said discrepancy product register by a field element $\alpha$ to obtain a m-bit product related to $d_n d_m^{-1}$ and storing said resultant product in said discrepancy register for possible further multiplication during a succeeding clock cycle;
 (8) converting, the contents of a plurality of said coefficient registers from an m-bit representation in said second basis to an m-bit representation in said first basis;
 (9) multiplying, during clock cycles included in said second set of clock cycles, the converted m-bit contents of certain ones of said plurality of said coefficient registers by the resultant m-bit product stored in step (8) in said discrepancy register to obtain a serial product;
 (10) serially accumulating, during clock cycles included in said second set of clock cycles, related ones of said serial products and loading said serial accumulations into appropriate ones of said coefficient registers;

(11) shifting the syndrome values stored in said syndrome registers into higher order syndrome registers included in said bank of syndrome registers and loading a higher order syndrome value into said first one of said syndrome registers;

(12) repeating steps (4) through (10);

(13) repeating steps (11) and (12) for successive higher order syndrome values up to and including $S_n - K - 1$; and,

(14) using the contents of the coefficient registers as coefficients of a locator polynomial.

16. The method of claim 15, wherein said inner product is obtained by performing a logical AND operation of the contents of a plurality of pairs of coefficient register and syndrome registers and summing the results of the logical AND operation performed with respect to each register pairs.

17. The method of claim 15, wherein said current discrepancy dn is obtained as having a serial format, wherein said step (6) of obtaining said quantity related to said multiplicative inverse $d_m^{-1}$ comprises the steps of:
converting said current discrepancy $d_n$ n from a serial format to a parallel format;
using said current discrepancy $d_n$ in a parallel format to determine a prior discrepancy $d_m$ in parallel format; and,
using the prior discrepancy $d_m$ to determine the quantity related to the multiplicative inverse $d_m^{-1}$ of the prior discrepancy.

18. The method of claim 17, wherein said quantity related to the multiplicative inverse $d_m^{-1}$ of said prior discrepancy is obtained by selecting an appropriate value stored in a memory.

19. The method of claim 15, wherein said step (6) of multiplying said current discrepancy dn by said quantity related to said multiplicative inverse $d_m^{-1}$ involves multiplying a serially formatted quantity $d_n$ by a parallel-formatted quantity $d_m^{-1}$.

20. The method of claim 19, wherein said serially-formatted quantity is applied to first input terminals of a plurality of logical AND gates, wherein second input terminals of said logical gates are connected to a unique lead included in a bus comprising a plurality of parallel leads for transmitting said parallel-formatted quantity and wherein said gates perform a logical AND operation upon their respective inputs.

21. The method of claim 20, wherein the results of said logical AND operations are applied to a gate whereat an exclusive OR (XOR) operation is performed.

22. The method of claim 15, wherein said step (9) of converting the contents of a plurality of said coefficient registers from said second basis representation to said first basis representation involves inputting the contents of a coefficient circuit into a converter circuit, the structure of said converter circuit being determined by a particular generator polynomial.

23. The method of claim 15, wherein said step (10) of multiplying the converted contents of certain ones of said plurality of coefficient register by the discrepancy product $d_n d_m^{-1}$ includes:
multiplying the product $d_n d_m^{-1}$ by a power i of a field member $\alpha$ to obtain a product $d_n d_m^{-1} \alpha^i$;
applying the product $d_n d_m^{-1} \alpha^i$ to first input terminals of a plurality of logical AND gates associated with respective certain ones of said coefficient registers; and,
applying the converted contents of each of a plurality of coefficient registers to second input terminals of respective ones of said plurality of logical AND gates.

24. The method of claim 23, wherein said codeword has n number of m-bit symbols including K informational symbols, and wherein said error locator polynomial has coefficients $\sigma_0, \sigma_1, \ldots \sigma_{n-K}$, and wherein the converted contents of the coefficient register for coefficient $\sigma_c$ is applied to the second input terminal of a logical AND gate associated with the coefficient register for coefficient $\sigma_{c+1}$, where $c = 1$ to $n - K - 1$.

25. Error correction apparatus for decoding a received codeword to obtain coefficients of a locator polynomial, said apparatus comprising:
a plurality of syndrome registers into which syndrome values, expressed in a first basis representation, are loadable;
a plurality of coefficient registers suited for storing therein coefficient values;
convolution circuit means for obtaining a current discrepancy dn, said convolution circuit means comprising a first bank of a plurality of parallel-in serial-out (PISO) multipliers, each of said PISO multipliers being adapted to operate upon the contents of a syndrome register in said first basis representation and upon the contents of a coefficient register in said second basis representation to obtain said current discrepancy $d_n$ in said second basis representation;
means for obtaining a quantity related to a multiplicative inverse $d_m^{-1}$ of a prior discrepancy dm, said quantity related to said multiplicative inverse $d_m^{-1}$ being expressed in said second basis representation;
means for multiplying said current discrepancy $d_n$ by said quantity related to said multiplicative inverse $d_m^{-1}$ to obtain a discrepancy product $d_n d_m^{-1}$;
means for converting the contents of a plurality of said coefficient registers from said second basis representation to said first basis representation;
a second bank of a plurality of parallel-in serial-out (PISO) multipliers, each of said PISO multipliers included in said second bank being adapted to multiply the converted contents of an appropriate one of said coefficient registers by the discrepancy product $d_n d_m^{-1}$ to obtain a serial product; and,
a plurality of accumulating means for accumulating, with respect to each of said PISO multipliers included in said second bank, successive serial products generated thereby, and for obtaining, with respect to each of said PISO multipliers included in said second bank, an accumulated value loadable into an appropriate on of said coefficient registers.

26. The apparatus of claim 25, wherein said current discrepancy $d_n$ is expressed in said second basis representation with a serial format, wherein said quantity related to said multiplicative inverse $d_m^{-1}$ is expressed in said second basis representation with a parallel format, and wherein said means for multiplying said current discrepancy $d_n$ by said quantity related to said multiplicative inverse $d_m^{-1}$ comprises a serial-in, parallel-out (SIPO) multiplier adapted to multiply said serially-formatted current discrepancy dn by said parallel-formatted quantity related to said multiplicative inverse $d_m^{-1}$ to obtain a parallel-formatted discrepancy product $d_n d_m^{-1}$ expressed in said second basis representation.

27. The apparatus of claim 26, wherein said SIPO multiplier comprises:
- a plurality of logical AND gates, each of said AND gates having first terminals thereof connected by a serial lead to said convolution circuit for receipt of said current discrepancy $d_n$ thereon, each of said AND gates having a second terminal connected to a unique lead in a m-bit lead cable emanating from said means for obtaining said quantity related to said multiplicative inverse $d_m^{-1}$; each of said AND gates having an output terminal;
- a logical exclusive OR (XOR) gate having input terminals including input terminals to which the output terminals of said AND gates comprising said SIPO multiplier are connected, said XOR gate also having an output terminal;
- register means for storing therein the result of a logical exclusive OR (XOR) operation performed by said XOR gate, said register having input terminals connected to the output terminal of said XOR gate.

28. The apparatus of claim 25, wherein each of said PISO multipliers included in said convolutional circuit means comprises:
- means for multiplying the contents of a respective one of said coefficient registers by a field element;
- logical AND gate means for performing a logical AND operation on the second basis-expressed contents of said respective one of said coefficient registers and on the first basis-expressed contents of a paired one of said syndrome registers to form an output; and,
- means for using said output from said AND gate in a logical exclusive OR (XOR) operation.

29. The apparatus of claim 28, wherein said means for multiplying the contents of a respective one of said coefficient registers by said field element includes:
- a feedback loop connecting an output terminal of said coefficient register with an input terminal thereof;
- multiplier means included in said feedback loop for multiplying the contents of said coefficient register by said field element to obtain a product; and,
- means for loading the product of said multiplier means into said coefficient register.

30. The apparatus of claim 25, wherein said current discrepancy $d_n$ is obtained as having a serial format, and wherein the means for obtaining the quantity related to to the multiplicative inverse $d_m^{-1}$ comprises: the multiplicative inverse $d_m^{-1}$ comprises
- means for converting said current discrepancy $d_n$ from a serial format to a parallel format;
- means for using said current discrepancy $d_n$ in a parallel format to determine a prior discrepancy $d_m$ in parallel format;
- means for using the prior discrepancy $d_m$ to obtain the quantity related to the multiplicative inverse $d_m^{-1}$ of prior discrepancy and for expressing the quantity related to the multiplicative inverse $d_m^{-1}$ of said prior discrepancy in said second basis representation.

31. The apparatus of claim 30, wherein said means for obtaining said quantity related to the multiplicative inverse $d_m^{-1}$ comprises a memory wherein a table of values are stored, and wherein said memory is addressable using a power of a field element.

32. The apparatus of claim 25, wherein each of said PISO multipliers comprising said second bank of PISO multipliers comprises:
- a discrepancy product register having a feedback loop connecting an output terminal thereof with its input terminal, said feedback loop including a multiplier for multiplying the contents of said discrepancy product register by a field element, said discrepancy product register and feedback loop being common to said plurality of PISO multipliers comprising said second bank of PISO multipliers;
- means for performing a logical AND operation on the contents of said discrepancy product register and the converted contents of an appropriate one of said coefficient registers and for obtaining a result; and,
- means for performing a logical exclusive OR (XOR) operation using said result from said logical AND operation.

33. The apparatus of claim 25, wherein one of said accumulating means comprises:
- a serial-to-parallel shift register loadable with the serial product of an appropriate one of said PISO multipliers included in said second bank of PISO multipliers; and,
- means for performing an exclusive OR (XOR) operation with respect to output data from said shift register and with respect to said serial product from said appropriate PISO multiplier.

34. A method of decoding a codeword to find coefficients of a locator polynomial, said method comprising the steps of:
(a) loading syndrome values into a plurality of syndrome registers, said syndrome registers being connected together in a manner wherein data stored in one of said registers is shiftable in a circular path to other of said registers;
(b) initializing a plurality of coefficient registers with initilization values, each of said coefficient registers being paired with a corresponding one of said syndrome registers;
(c) multiplying the contents of said syndrome registers and the contents of said coefficient registers in a manner to obtain a current discrepancy;
(d) multiplying said current discrepancy by a value related to a multiplicative inverse of a prior discrepancy in a manner to obtain a discrepancy product;
(e) using a value related to the contents of said coefficient registers and said discrepancy product in a manner to obtain an updated value for at least one of said coefficiency registers;
(f) shifting the contents of each of said syndrome registers to an adjacent syndrome register, said shifting occurring in a first direction along said circular path;
(g) repeating steps (c) through (f) for a plurality of iterations;
(h) multiplying the contents of at least one of said syndrome registers by the contents of a paired one of said coefficient registers to obtain a modified syndrome value;
(i) shifting the contents of each of said syndrome registers to an adjacent syndrome register, said shifting occurring in a second direction along said circular path;
(j) storing said modified syndrome value in a select one of said syndrome registers, and, (k) repeating steps (h) through (j) for a plurality of iterations.

35. The method of claim 34, further comprising the step of using said modified syndrome values stored in said syndrome registers to determine error magnitudes.

36. Apparatus for decoding a codeword to find coefficients of a locator polynomial, said apparatus comprising:

means for loading syndrome values into a plurality of syndrome registers, said syndrome registers being connected together in a manner wherein data stored in one of said registers is shiftable in a circular path to others of said registers;

means for initializing a plurality of coefficient registers with initialization values, each of said coefficient registers being paired with a corresponding one of said syndrome registers;

means for multiplying the contents of said syndrome registers and the contents of said coefficient registers in a manner to obtain a current discrepancy;

means for multiplying said current discrepancy by a value related to a multiplicative inverse of a prior discrepancy in a manner to obtain a discrepancy product;

means for using a value related to the contents of said coefficient registers and said discrepancy product in a manner to obtain an updated value for at least one of said coefficiency registers;

means for shifting the contents of each of said syndrome registers to an adjacent syndrome register said shifting occurring in a first direction along said circular path;

means for multiplying the contents of at least one of said syndrome registers by the contents of a paired one of said coefficient registers to obtain a modified syndrome value;

means for shifting the contents of each of said syndrome registers to an adjacent syndrome register, said shifting occurring in a second direction along said circular path; and, means for storing said modified syndrome value in a select one of said syndrome registers.

37. Error correction apparatus for decoding a received codeword, the apparatus comprising a plurality of registers for storing therein syndromes of the codeword, a plurality of coefficient registers wherein coefficients of a locator polynomial are accumulated, means for operating upon the contents of said syndrome registers and the contents of said coefficient registers to determine a current discrepancy, means for obtaining a discrepancy product by multiplying the current discrepancy by a multiplicative inverse of a prior discrepancy, means for multiplying the discrepancy product by the contents of the coefficient registers and for accumulating the product in the coefficient registers, characterized in that said means for operating upon said syndrome registers and said coefficient registers operates upon syndromes having a first basis representation and upon values in said coefficient registers having a second basis representation;

the means for obtaining the discrepancy product obtains such a product having a second basis representation;

means are provided to convert the contents of said coefficient register from a second basis representation to a first basis representation; and, the means for multiplying the discrepancy product multiplies such product by values related to the converted first basis representation of the coefficient registers for accumulating the resultant product in second basis representation in said coefficient registers.

38. The apparatus of claim 37, wherein the means for multiplying the current discrepancy product by values related to the converted first basis representation of the coefficient registers can multiply the values related to the converted first basis representation of the coefficient registers by erasure locator values having a second basis representation.

39. The apparatus of claim 37, wherein the means for operating upon the contents of the syndrome registers and the contents of the coefficient register determines an inner product using the contents of the syndrome registers and the contents of the coefficient registers, and wherein said inner product is in a serial format.

40. The apparatus of claim 37, wherein the means for operating upon the contents of the syndrome registers and the contents of the coefficient registers comprises a first bank of a plurality of parallel-in serial-out (PISO) multipliers, each of said PISO multipliers being adapted to operate upon the contents of a syndrome register in said first basis representation and upon the contents of a coefficient register in said second basis representation to obtain the current discrepancy in said second basis representation, and wherein each of the PISO multipliers comprises:

means for multiplying the contents of a respective one of said coefficient registers by a field element;

logical AND gate means for performing a logical AND operation on the second basis-expressed contents of said respective one of said coefficient registers and on the first basis-expressed contents of a paired one of said syndrome registers to form an output; and, means for using said output from said AND gate in a logical exclusive OR (XOR) operation.

41. The apparatus of claim 40, wherein said means for multiplying the contents of a respective one of said coefficient registers by said field element includes:

a feedback loop connecting an output terminal of said coefficient register with an input terminal thereof;

multiplier means included in said feedback loop for multiplying the contents of said coefficient register by said field element to obtain a product; and, means for loading the product of said multiplier means into said coefficient register.

42. The apparatus of claim 37, wherein said current discrepancy is expressed in said second basis representation with a serial format, wherein a quantity related to said multiplicative inverse is expressed in said second basis representation with a parallel format, and wherein the current discrepancy is multiplied by a quantity related to the multiplicative inverse by a serial-in, parallel-out (SIPO) multiplier adapted to multiply the serially-formatted current discrepancy by a parallel-formatted quantity related to the multiplicative inverse to obtain a parallel-formatted discrepancy product expressed in said second basis representation.

43. The apparatus of claim 42, wherein said SIPO multiplier comprises:

a plurality of logical AND gates, each of said AND gates having first terminals thereof connected by a serial lead to said convolution circuit for receipt of said current discrepancy thereon, each of said AND gates having a second terminal connected to a unique lead in a cable emanating from said means for obtaining said quantity related to said multiplicative inverse, each of said AND gates having an output terminal;

a logical exclusive OR (XOR) gate having input terminals including input terminals to which the output terminals of said AND gates comprising said SIPO multiplier are connected, said XOR gate also having an output terminal;

means for converting said current discrepancy from a serial format to a parallel format;

means for using said current discrepancy in a parallel format to determine a prior discrepancy in parallel format;

means for using the prior discrepancy to obtain the quantity related to the multiplicative inverse of prior discrepancy and for expressing the quantity related to the multiplicative inverse of said prior discrepancy in said second basis representation.

44. The apparatus of claim 37, wherein the means for multiplying the discrepancy product by a value related to the converted first basis representation of the coefficient registers comprises a second bank of a plurality of parallel-in serial-out (PISO) multipliers, and wherein each of said PISO multipliers comprising said second bank of PISO multipliers comprises:

a discrepancy product register having a feedback loop connecting an output terminal thereof with its input terminal, said feedback loop including a multiplier for multiplying the contents of said discrepancy product register by a field element, said discrepancy product register and feedback loop being common to said plurality of PISO multipliers comprising said second bank of PISO multipliers;

means for performing a logical AND operation on the contents of said discrepancy product register and the converted contents of an appropriate one of said coefficient registers and for obtaining a result; and, means for performing a logical exclusive OR (XOR) operation using said result from said logical AND operation.

45. The apparatus of claim 44, further comprising a plurality of accumulating means, and wherein one of said accumulating means comprises:

a serial-to-parallel shift register loadable with the serial product of an appropriate one of said PISO multipliers included in said second bank of PISO multipliers; and, means for performing an exclusive OR (XOR) operation with respect to output data from said shift register and with respect to said serial product from said appropriate PISO multiplier.

46. The apparatus of claim 37, further comprising:

means for multiplying the contents of at least one of said syndrome registers by the contents of a paired one of said coefficient registers to obtain a modified syndrome value in a second basis representation.

47. The apparatus of claim 46, further comprising:

means for using the contents of the coefficient registers to locate bytes in a codeword wherein an error or erasure occurs and to generate a divisor;

means for using modified syndromes stored in the syndrome registers to generate an error pattern dividend;

means for multiplying the divisor by the dividend to obtain a product and for accumulating the products of successive each multiplications; and, means for converting the accumulated product from a second basis representation to a first basis representation.

48. The method of claim 37, wherein the values related to the converted first basis representation of the coefficient registers are multiplied by erasure locator values having a second basis representation rather than by said discrepancy product.

49. An error correction method for decoding a received codeword, the method being of the type wherein a plurality of syndrome registers are loaded to store therein syndromes of the codeword, wherein a current discrepancy is determined by operating upon the contents of the syndrome registers and a plurality of coefficient registers wherein coefficients of a locator polynomial are accumulated, wherein a discrepancy product is obtained by multiplying the current discrepancy by a multiplicative inverse of a prior discrepancy, wherein the discrepancy product is multiplied by the contents of the coefficient registers to obtain products accumulated in the coefficient registers, wherein the improvement comprises the steps of:

determining the current discrepancy by operating upon the contents of the syndrome registers having a first basis representation and upon values in the coefficient registers having a second basis representation;

obtaining a discrepancy product having a second basis representation;

converting the contents of the coefficient registers from a second basis representation to a first basis representation;

multiplying the discrepancy product in a second basis representation by values related to the converted first basis representation of the coefficient registers; and, accumulating the resulting product in second basis representation in said coefficient register.

50. The method of claim 49, wherein said step 21 of obtaining a current discrepancy comprises the step of:

determining an inner product using the contents of a plurality of pairs of coefficient registers and syndrome registers, and wherein said inner product is a serial format.

51. The method of claim 49, wherein syndrome values are simultaneously loaded into appropriate ones of said plurality of syndrome registers.

52. The method of claim 49, wherein the current discrepancy is obtained as having a serial format, wherein a quantity related to said multiplicative inverse comprises the steps of:

converting said current discrepancy from a serial format to a parallel format;

using said current discrepancy in a parallel format to determine a prior discrepancy in parallel format; and, determining the quantity related to the multiplicative inverse of said prior discrepancy and expressing said quantity the in said second basis representation.

53. The method of claim 49, further comprising the step of:

shifting the contents of each of the syndrome registers to an adjacent syndrome register, said shifting occurring in a first direction along a circular path connecting the syndrome registers.

54. The method of claim 49, wherein after all syndromes have been obtained, the contents of at least one of the syndrome registers is multiplied by the contents of a paired one of the coefficient registers to obtain a modified syndrome value having a second basis representation.

55. The apparatus of claim 54, further comprising: using the contents of the coefficient registers to locate bytes in a codeword wherein an error or erasure occurs and to generate a divisor;

using modified syndromes stored in the syndrome registers to generate an error pattern dividend;

multiplying the divisor by the dividend to obtain a product and accumulating the products of successive such multiplications; and, converting the accumulated product from a second basis representation to a first basis representation.

* * * * *